(12) United States Patent
Klejsa et al.

(10) Patent No.: US 9,041,568 B2
(45) Date of Patent: May 26, 2015

(54) ESTIMATOR FOR ESTIMATING A PROBABILITY DISTRIBUTION OF A QUANTIZATION INDEX

(71) Applicant: Huawei Technologies Co., Ltd., Shenzhen, Guangdong (CN)

(72) Inventors: Janusz Klejsa, Stockholm (SE); Minyue Li, Solna (SE); Willem Bastiaan Kleijn, Lower Hut (NZ)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/186,237

(22) Filed: Feb. 21, 2014

(65) Prior Publication Data

US 2014/0191888 A1    Jul. 10, 2014

Related U.S. Application Data

(63) Continuation of application No. PCT/CN2011/078774, filed on Aug. 23, 2011.

(51) Int. Cl.
| | |
|---|---|
| *H03M 7/00* | (2006.01) |
| *H03M 7/30* | (2006.01) |
| *H04N 19/463* | (2014.01) |
| *H04N 19/91* | (2014.01) |

(52) U.S. Cl.
CPC ............. *H03M 7/00* (2013.01); *H03M 7/3079* (2013.01); *H04N 19/463* (2014.11); *H04N 19/91* (2014.11)

(58) Field of Classification Search
CPC .............................. H03M 7/00; H03M 7/3079

USPC ............................ 341/50, 106, 107, 51, 67, 65
See application file for complete search history.

(56) References Cited

U.S. PATENT DOCUMENTS

| | | |
|---|---|---|
| 4,933,833 A | 6/1990 | Petroff |
| 5,025,258 A | 6/1991 | Duttweiler |
| 5,298,896 A | 3/1994 | Lei et al. |
| 5,986,594 A | 11/1999 | Nakayama et al. |

(Continued)

FOREIGN PATENT DOCUMENTS

| | | |
|---|---|---|
| CN | 1207833 A | 2/1999 |
| EP | 0 864 205 B1 | 4/2002 |

(Continued)

OTHER PUBLICATIONS

Thomas M. Cover, et al., "Elements of Information Theory", Jun. 1991, 36 pages.

(Continued)

*Primary Examiner* — Peguy Jean Pierre

(57) ABSTRACT

The invention relates to an estimator for estimating a probability distribution of a quantization index generated from a source coder encoding a source signal, into a sequence of quantization indices, the source signal being described by a signal model, the source coder providing a current quantization index and current side information, the estimator being configured to obtain auxiliary parameters based on a configuration of the source coder and the current available side information and the signal model, the estimator being further configured to adaptively update the probability distribution of a quantization index upon the basis of a probability density function relating to a previous state of the estimator, the auxiliary parameters, the current quantization index and the current side information.

26 Claims, 12 Drawing Sheets

(56) References Cited

U.S. PATENT DOCUMENTS

| | | | |
|---|---|---|---|
| 6,188,795 | B1 | 2/2001 | Brady et al. |
| 6,411,231 | B1 | 6/2002 | Yanagiya et al. |
| 6,489,903 | B2 | 12/2002 | Kimura et al. |
| 6,850,175 | B1 | 2/2005 | Bossen |
| 7,079,050 | B2 | 7/2006 | Van Der Vleuten et al. |
| 7,183,951 | B2 | 2/2007 | Bossen |
| 7,319,417 | B2 | 1/2008 | Wu et al. |
| 7,573,952 | B1 | 8/2009 | Thampy et al. |
| 7,898,406 | B2 | 3/2011 | Darshan et al. |
| 7,982,641 | B1 * | 7/2011 | Su et al. .................. 341/107 |
| 8,542,940 | B2 * | 9/2013 | Yang et al. ................. 382/251 |
| 8,907,823 | B2 * | 12/2014 | Marpe et al. ............... 341/107 |
| 2003/0210824 | A1 | 11/2003 | Falzon et al. |
| 2008/0240597 | A1 | 10/2008 | He et al. |

FOREIGN PATENT DOCUMENTS

| | | |
|---|---|---|
| WO | WO 2008/058692 A1 | 5/2008 |
| WO | WO 2011/033103 A1 | 3/2011 |

OTHER PUBLICATIONS

Jorma Rissanen, et al., "Universal Modeling and Coding", IEEE Transactions on Information Theory, vol. IT-27, No. 1, Jan. 1981, p. 12-23.

Gopinath R. Kuduvalli, et al., "Performance Analysis of Reversible Image Compression Techniques for High-Resolution Digital Teleradiology", IEEE Transactions on Medical Imaging, vol. 11, No. 3, Sep. 1992, p. 430-445.

Kwang Taik Kim, et al., "Sending a Lossy Version of the Innovations Process in Suboptimal in QG Rate-Distortion", 2005, 5 pages.

Yufei Huang, et al., "The Rejection Gibbs Coupler: A Perfect Sampling Algorithm and Its Application to Truncated Multivariate Gaussian Distributions", IEEE, 2001, p. 42-45.

Xiaolin Wu, "Lossless Compression of Continuous-Tone Images via Context Selection, Quantization, and Modeling", IEEE Transactions on Image Processing, vol. 6, No. 5, May 1997, p. 656-664.

Sean Dorward, et al., "Low Delay Perceptually Lossless Coding of Audio Signals", 2001, 9 pages.

Paul G. Howard, et al., "Arithmetic Coding for Data Compression", Proceedings of the IEEE, vol. 82, No. 6, Jun. 1994, p. 857-865.

Ram Zamir, et al., "Information Rates of Pre/Post-Filtered Dithered Quantizers", IEEE Transactions on Information Theory, vol. 42, No. 5, Sep. 1996, p. 1340-1353.

Jun Seok Song, et al., "Conditional arithmetic coding of tree structured vector quantisation indices with reduced memory", Electronic Letters, vol. 33, No. 5, Feb. 27, 1997, p. 360-362.

Philip A. Chou, et al., "Conditional Entropy-Constrained Vector Quantization of Linear Predictive Coefficients", IEEE, 1990, p. 197-200.

Soren Forchhammer, et al., "Context Quantization by Minimum Adaptive Code Length", IEEE, Jun. 24-29, 2007, p. 246-250.

Frank Muller, et al., "Embedded Laplacian Pyramid Image Coding Using Conditional Arithmetic Coding", IEEE 1996, p. 221-224.

David A. Huffman, et al., A Method for the Construction of Minimum-Redundancy Codes, Proceedings of the I.R.E., Sep. 1952, p. 1098-1101.

Jacob Ziv, et al., A Universal Algorithm for Sequential Data Compression, IEEE Transactions on Information Theory, vol. IT-23, No. 3, May 1977, p. 337-343.

Ram Zamir, et al., "Achieving the Gaussian Rate-Distortion Function by Prediction", IEEE Transactions on Information Theory, Vo. 54, No. 7, Jul. 2008, p. 3354-3364.

Gerhard Kramer, "Directed Information for Channels with Feedback", 1998, 149 pages.

G. Pavlidis, et al., "A Vector Quantization-Entropy Coder Image Compression System", 6 pages.

Christopher M. Bishop, "Pattern Recognition and Machine Learning", 2006, 701 pages.

Robert J. Elliott, et al., "Hidden Markov Models, Estimation and Control", 1995, 373 pages.

Petre Stoica, et al., "Spectral Analysis of Signals", 2005, 447 pages.

* cited by examiner

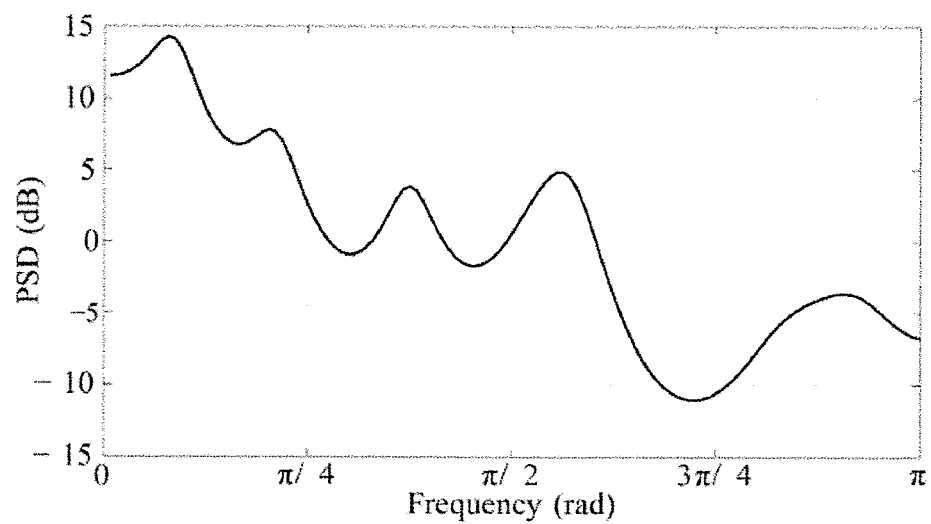
Fig. 5
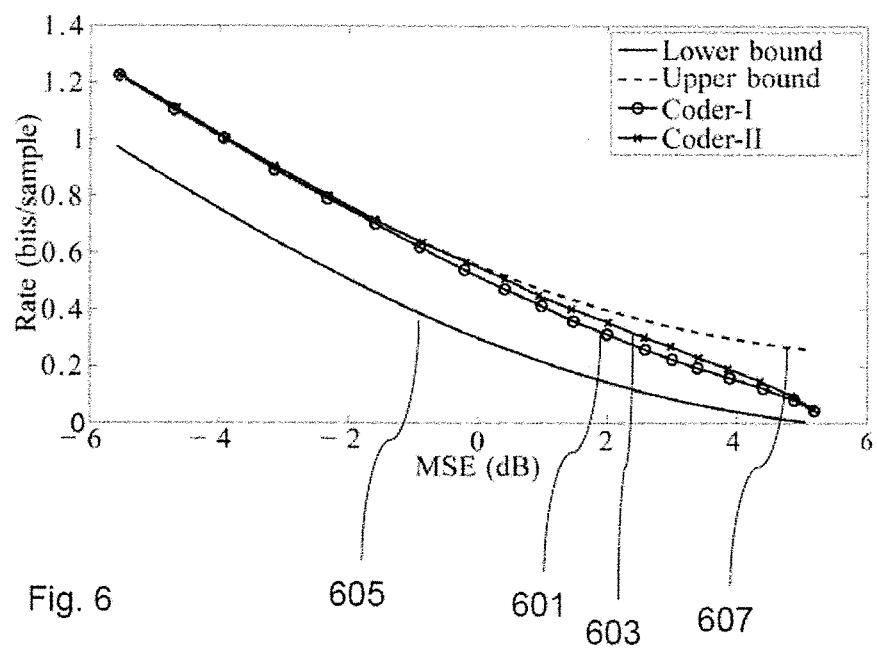
Fig. 6    605    601    603    607

ESTIMATOR FOR ESTIMATING A PROBABILITY DISTRIBUTION OF A QUANTIZATION INDEX

CROSS-REFERENCE TO RELATED APPLICATIONS

This application is a continuation of International Application No. PCT/CN2011/078774, filed on Aug. 23, 2011, all of which are hereby incorporated by reference in its entirety.

TECHNICAL FIELD

The invention relates to the field of digital signal processing, in particular to source coding.

BACKGROUND

In modern coding systems, values of a source signal are mapped to a smaller set of values which are called quantization values. Such coding may be performed by a lossy coder as shown in FIG. 1.

The lossy coding system comprises a quantizer 101 that implements a mapping from a value of the input signal into a so-called quantization index, a lossless coder 103 that performs conversion of the quantization index into a binary codeword ("Code") that will be stored and/or transmitted to represent the signal value and at least one reconstructor 105 that comprises lossless decoder and inverse quantizer (a mapping form a reconstructed index to the signal reconstruction) providing signal reconstruction. The quantizer 101 and the reconstructor 105 conduct a trade-off between the rate, usually in bits/sample, that the lossless coder can achieve and a distortion defined on the source and its reconstruction. The lossless coder 103 aims to produce the shortest code given the quantization indices.

The minimum expected rate is known to be the per-sample entropy of the sequence being encoded as described in T. M. Cover and J. A. Thomas, Elements of Information Theory, 2nd ed. John Wiley & Sons, 2006, which can be achieved by entropy coding paradigms. Widely used entropy coding methods include the Lempel-Ziv code as described in J. Ziv and A. Lempel, "A universal algorithm for sequential data compression," IEEE Transactions on Information Theory, vol. 23, no. 3, pp. 337-343, 1977., the Huffman code as described in D. A. Huffman, "A method for the construction of minimum-redundancy codes," Proceedings of the IRE, vol. 40, no. 9, pp. 1098-1101, 1952., and the arithmetic coding [P. G. Howard and J. S. Vitter, "Arithmetic coding for data compression," Proceedings of the IEEE, vol. 82, no. 6, pp. 857-865, 1994.]. The Lempel-Ziv code as described in J. Ziv and A. Lempel, "A universal algorithm for sequential data compression," IEEE Transactions on Information Theory, vol. 23, no. 3, pp. 337-343, 1977, achieves the optimal rate when the sequence is ergodic and the length of the sequence approaches infinity. It does not require any statistical model or any explicit modeling of the input, which makes it universal.

However, due to the strong condition for optimality and the ignorance of model, it usually brings worse performance than other methods in practice as described in G. R. Kuduvalli and R. M. Rangayyan, "Performance analysis of reversible image compression techniques for high-resolution digital teleradiology," IEEE Transactions on Medical Imaging, vol. 11, no. 3, pp. 430-445, 1992., and in S. Dorward, D. Huang, S. A. Savari, G. Schuller, and B. Yu, "Low delay perceptually lossless coding of audio signals," in Proc. DCC 2001. Data Compression Conf, 2001, pp. 312-320.

The Huffman code uses a probabilistic model and can perform well for short and/or non-ergodic sequences. However, it encodes the entire sequence at once to approach the optimality, thus incurring large delay and computational complexity. It is known that the optimal code length can be achieved more efficiently by coding the samples sequentially, in light of the chain rule of the entropy:

$$a) \; H(Q_1, \ldots, Q_N) = \sum_{i=1}^{N} H(Q_i | Q_1, \ldots, Q_{i-1}). \quad (1)$$

This can be implemented by entropy coders that facilitate fractional code length such as the arithmetic coding. The key to sequential entropy coding is to obtain the conditional probability distribution of a sample given all samples ahead of it. The conditional probability, since it depends on all the past samples, may require a prohibitive computational effort. To address this problem, while maintaining the sequential coding manner, commonly two strategies are employed predictive coding and Markovian assumption.

Predictive coding aims to transform the source by prediction such that quantizing the transformed source leads to independent indices. Exact independence of the quantization indices is only achievable in special situations, e.g., when the prediction is open-loop and the source is a Gaussian process, or when both the source and the quantization noise are Gaussian processes in the case of closed-loop prediction as described in R. Zamir, Y. Kochman, and U. Erez, "Achieving the Gaussian rate-distortion function by prediction," IEEE Transactions on Information Theory, vol. 54, no. 7, pp. 3354-3364, 2008.

It shall be noted that although the open-loop prediction has a lighter requirement for achieving the independence of quantization indices, it is less commonly used because it leads to a poorer rate-distortion trade-off than closed-loop prediction in practical coders, and proves to be unable to meet the rate-distortion function in theory as described in K. T. Kim and T. Berger, "Sending a lossy version of the innovations process is suboptimal in QG rate-distortion," in Proc. Int. Symp. Information Theory ISIT 2005, 2005, pp. 209-213.

The other technique for computationally inexpensive entropy coding is to assume Markovianity of the quantization indices, meaning that the conditional probability of a sample depends only on a subset of its preceding samples. However, the Markovianity of the quantization indices is a strong assumption. Particularly, even if the source is Markovian, the quantization may damage this property.

Due to a non-linear nature of quantization it is, however, often difficult estimate the probability of a quantization index, in particular, to capture and exploit the statistical dependency between the quantization indices.

In practice, the statistical dependencies between the quantization indices are often neglected or a zero-order entropy coding is performed, which may lead to a degraded coding performance. Alternatively, one may consider usage of high-order entropy coding, which is able to capture the statistical dependencies between the quantization indices. However, it may be associated with a large computational complexity.

SUMMARY

It is therefore the object of the invention to provide an efficient concept for determining a probability distribution of quantization indices.

This object is achieved by the features of the independent claims. Further implementation forms are disclosed in the description, the figures and the dependent claims.

The invention is based on the finding, that, instead of assuming independency or Markovianity of the quantization indices, the probability distribution of a quantization index may adaptively, in particular recursively, be updated given the past quantization indices, in particular all quantization indices, and available side information relating to the source coder, which may be determined. Thus, together with an entropy coder, an optimal rate may be achieved when coding long sequences. Furthermore, sequential entropy coding with update recursion on probability of quantization indices may be performed. The update recursion on index probability is derived from a linear stochastic system model of the source signal.

According to a first aspect, the invention relates to an estimator for estimating a probability distribution of a quantization index generated from a source coder encoding a source signal, into a sequence of quantization indices, the source signal being described by a signal model, the source coder providing a current quantization index and current side information, the estimator being configured to obtain auxiliary parameters based on a configuration of the source coder and the current available side information and the signal model, the estimator being further configured to adaptively update the probability distribution of a quantization index upon the basis of a probability density function relating to a previous state of the estimator, the auxiliary parameters, the current quantization index and the current side information.

According to a first possible implementation form of the first aspect, the current side information indicates a current configuration of the source coder, wherein the estimator is configured to derive the current auxiliary parameters from the signal model, in particular from a linear stochastic signal model of the source signal.

According to a second possible implementation form of the first aspect as such or according to the preceding implementation form of the first aspect, the estimator is configured to derive the current auxiliary parameters from the signal model and the side information, in particular obtained from a linear stochastic signal model of the source signal.

According to a third possible implementation form of the first aspect as such or according to any of the preceding implementation forms of the first aspect, the current side information indicates a current configuration of the source coder, wherein the estimator is configured to derive the current auxiliary parameters from a statistical model of the source signal, in particular obtained from a linear stochastic signal model of the source signal, and wherein the estimator is further configured to update the probability density function using information on the current quantization index and the current parameters of the model of the source signal.

According to a fourth possible implementation form of the first aspect as such or according to any of the preceding implementation forms of the first aspect, the estimator is configured to derive the auxiliary parameters from an Auto-Regressive-Moving-Average model of the source signal.

According to a fifth possible implementation form of the first aspect as such or according to any of the preceding implementation forms of the first aspect, the side information provided by the source coder comprises a realization of a dither signal generated by the source coder.

According to a sixth possible implementation form of the first aspect as such or according to any of the preceding implementation forms of the first aspect, the side information indicates an outcome of a prediction of the source signal performed in the source coder.

According to a seventh possible implementation form of the first aspect as such or according to any of the preceding implementation forms of the first aspect, the side information indicates a realization of dither signal and an outcome of a closed-loop prediction of the source signal performed in the source coder. This side information is called in the following as a type I side information provided by a source coder operating in a configuration for which $S_n \perp \Xi_n | \{S_1^{n-1}, Q_1^{n-1}\}$, wherein dithering is included.

According to an eighth possible implementation form of the first aspect as such or according to any of the preceding implementation forms of the first aspect, the side information indicates an open-loop prediction of the source signal performed in the source coder and delayed observation of the source signal. This side information is called in the following as type II side information provided by a source coder operating in a configuration for which $S_n \perp \{S_1^{n-1}, Q_1^{n-1}\} | \Xi_n$.

Type II of side information includes, for example, an outcome of an open-loop prediction.

According to an ninth possible implementation form of the first aspect as such or according to any of the preceding implementation forms of the first aspect, the probability function relating to the state of the estimator is $f(\xi_n | q_1^{n-1}, s_1^{n-1}) \propto \int_A f(\xi_{n-1} | q_1^{n-2}, s_1^{n-1}) f(\xi_n | \xi_{n-1}) p(q_{n-1} | \xi_{n-1}, s_{n-1}) d\xi_{n-1}$, where $\xi_n$ is the n-th realization of the hidden state (207), A denotes the alphabet from which the hidden states take values, $q_1^{n-1}$ is a vector containing n−1 previous indices and $s_1^{n-1}$ is a vector containing n−1 previous realizations of side information $S_1^{n-1}$, and $f(\xi_{n-1} | q_1^{n-2}, s_1^{n-1})$ is the probability density function relating to the previous state of the estimator, $f(\xi_n | \xi_{n-1})$ is a conditional probability density function of current state given previous state, and $p(q_{n-1} | \xi_{n-1}, s_{n-1})$ is the probability of the previous quantization index $q_{n-1}$, the previous hidden state $\xi_{n-1}$ and the previous realization of the side information $s_{n-1}$.

According to a tenth possible implementation form of the first aspect as such or according to any of the preceding implementation forms of the first aspect, the estimator is configured to adaptively update the probability of a quantization index $p(q_{n-1} | q_1^{n-1}, s_1^n)$ upon the basis of updating the probability density function relating to the state of the estimator to in response the current side information $s_n$ according to $f(\xi_n | q_1^{n-1}, s_1^n) \propto f(\xi_n | q_1^{n-1}, s_1^{n-1}) f(s_n | \xi_n, q_1^{n-1}, s_1^{n-1})$, where $f(\xi_n | q_1^{n-1}, s_1^{n-1})$ is the probability density function relating to the previous state of the estimator and $f(s_n | \xi_n, q_1^{n-1}, s_1^{n-1})$ is the probability density function of the current side information $s_n$ conditioned on the current state $\xi_n$, all previous quantization indices represented by the vector $q_1^{n-1}$ and all the previous side information represented by $s_1^{n-1}$, where $f(s_n | \xi_n, q_1^{n-1}, s_1^{n-1})$ is computed in response to the current side information, wherein the probability distribution of a quantization index being updated according to $p(q_n | q_1^{n-1}, s_1^n) = \int_A p(q_n | \xi_n, s_n) f(\xi_n | q_1^{n-1}, s_1^n) d\xi_n$, where $p(q_n | \xi_n, s_n)$ is the probability distribution of a quantization index $q_n$ conditioned on the current state of the estimator $\xi_n$ and current side information $s_n$.

According to an eleventh possible implementation form of the first aspect as such or according to any of the preceding implementation forms of the first aspect, the estimator is configured to adaptively update the probability distribution of a quantization index upon the basis of the following estimate of the probability density function relating to the state of the estimator:

$f(\xi_n|q_1^{n-1},s_1^{n-1}) \approx N(\xi_n;\mu_n,\Sigma_n)$, wherein the mean $\mu_n$ is computed as the expectation about the current hidden state $\Xi_n$, given all previous quantization indices and all previous realizations of side information, according to $\mu_n=E\{\Xi_n|Q_1^{n-1},S_1^{n-1}\}$, and wherein the covariance matrix is computed according to $\Sigma_n=E\{(\Xi_n-\mu_n)(\Xi_n-\mu_n)^T|Q_1^{n-1},S_1^{n-1}\}$, where $^T$ denotes matrix transposition and E denotes an expectation.

According to a second aspect, the invention relates to a coding apparatus for coding a source signal, the coding apparatus comprising a source coder for coding the source signal into a sequence of quantization indices, the source coder being configured to provide a current quantization index and current side information, a lossless coder being configured to encode the quantization indices into code words in dependency on a probability distribution of a quantization index, and the estimator of the first aspect or of any of the implementation form of the first aspect for estimating a probability of a quantization index.

According to a third aspect, the invention relates to a decoding apparatus for decoding a source signal being encoded by a source coder using quantization indices, the decoding apparatus comprising the estimator of the first aspect or of any of the implementation form of the first aspect for estimating a probability of a quantization index, and a decoder for decoding a sequence of quantization indices and for providing a current quantization index for a reconstruction of the source signal based on the probability of the quantization index.

According to a fourth aspect, the invention relates to an estimation method for estimating a probability distribution of a quantization index generated from a source coder encoding a source signal into a sequence of quantization indices, the source signal being described by a signal model, the source coder providing a current quantization index and current side information, the method comprising obtaining auxiliary parameters based on a configuration of the source coder, the current available side information and the signal model, and adaptively updating the probability of the quantization index upon the basis of a probability density function relating to a previous state of the estimator, the auxiliary parameters, the current quantization index and the current side information.

According to a fifth aspect, the invention relates to a coding method for coding a source signal, the coding method comprising encoding the source signal into a sequence of quantization indices and providing a current quantization index and current side information, losslessly encoding the quantization indices into code words in dependency on a probability of the quantization indices, and estimating the probability distribution of a quantization index generated from the source coder according to the method for estimating a probability distribution of a quantization according to the fourth aspect of the invention.

According to a sixth aspect, the invention relates to a decoding method for decoding a source signal, the coding method comprising estimating the probability distribution of a quantization index generated from the source coder according to the method for estimating a probability distribution of a quantization index according to the fourth aspect of the invention, and decoding a sequence of quantization indices and providing a current quantization index and current side information into a reconstruction of a source signal based on the probability distribution of a quantization index.

According to a seventh aspect, the invention relates to a computer program for performing the method of one of the aspects four to six of the invention when run on a computer.

The invention can be implemented in digital electronic circuitry, or in computer hardware, firmware, software, or in combinations thereof.

BRIEF DESCRIPTION OF THE DRAWINGS

Further embodiments are described with respect to the figures, in which:

FIG. 5 shows the PSD over frequency according to an implementation form;

FIG. 6 shows a rate (bits/sample) over the MSE in dB according to an implementation form;

DETAILED DESCRIPTION

In the following, modeling a lossy coding system will be described. The model avoids unnecessary assumptions which are usually seen in the literature. Examples of such assumptions include for example assuming the quantization noise to be independent of the source, to be white and/or to follow a normal distribution.

The coding system generally operates on the source block-by-block. The n-th block of the source is denoted as $X_n$, and the alphabet from which $X_n$ takes values as X. It is assumed that the source can be described by a hidden Markov model (HMM) as described in R. J. Elliott, J. B. Moore, and Lakhadar, Hidden Markov Models: estimation and control, Springer-Verlag, 1995. The state of the HMM's hidden variable at time n is denoted by $\Xi_n$. For briefness, $\Xi_n$ is called the hidden state at time n. The source block $X_n$ is an observation of the hidden state $\Xi_n$.

The assumption of the existence of an HMM for the source is mild. A large range of signals, including all autoregressive moving average (ARMA) processes, can be associated with an HMM. ARMA processes are discussed in more detail later.

In the coding system, common information can be shared among the quantizer, the lossless coder, and the reconstructor. This information is known as the side information and herein denoted as $S_n$. Examples of side information include adaptive transforms, prediction on the current source block, dither signals, and signals that are correlated with the source. The quantizer maps a source block, often with the help of the side information, to a quantization index, an integer, and is denoted as function $Q_n=q(X_n|S_n)$. The lossless coder maps the quantization indices and the side information to a code, usually a zero-one sequence. Finally, the reconstructor maps the code and the side information to a reconstruction of the source.

The side information is restricted to be causal, meaning it is conditionally independent of the future variables given the current and the past variables. In particular, it is constrained that the conditional probability distribution of the current side information is to be determined by the past side information, the past quantization indices, and the current hidden state. It is in generally not allowed that any source blocks and past hidden states are to be direct causes of the current side information for simplicity. This simplification does not significantly affect generality, since it is usually possible to redefine the hidden states to fulfill such requirement. It is noted that the side information may involve addition transmission and such transmission is not considered in the following.

The relation of the variables in a lossy coding system can be described by a graphical model as described in T. Koski and J. M. Noble, Bayesian Networks: an introduction. John Wiley & Sons, 2009.

Figure 1:
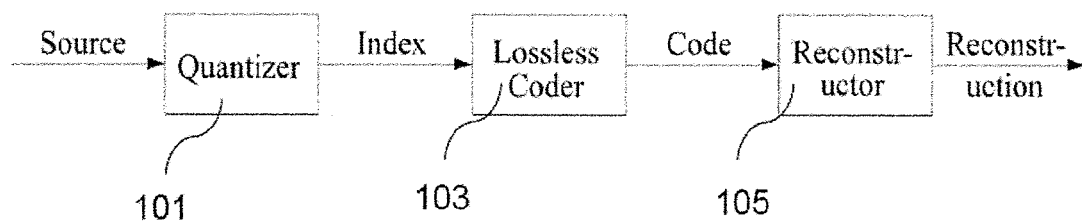
FIG. 1 shows a block diagram of a lossy coding system according to an implementation form.
Figure 2:
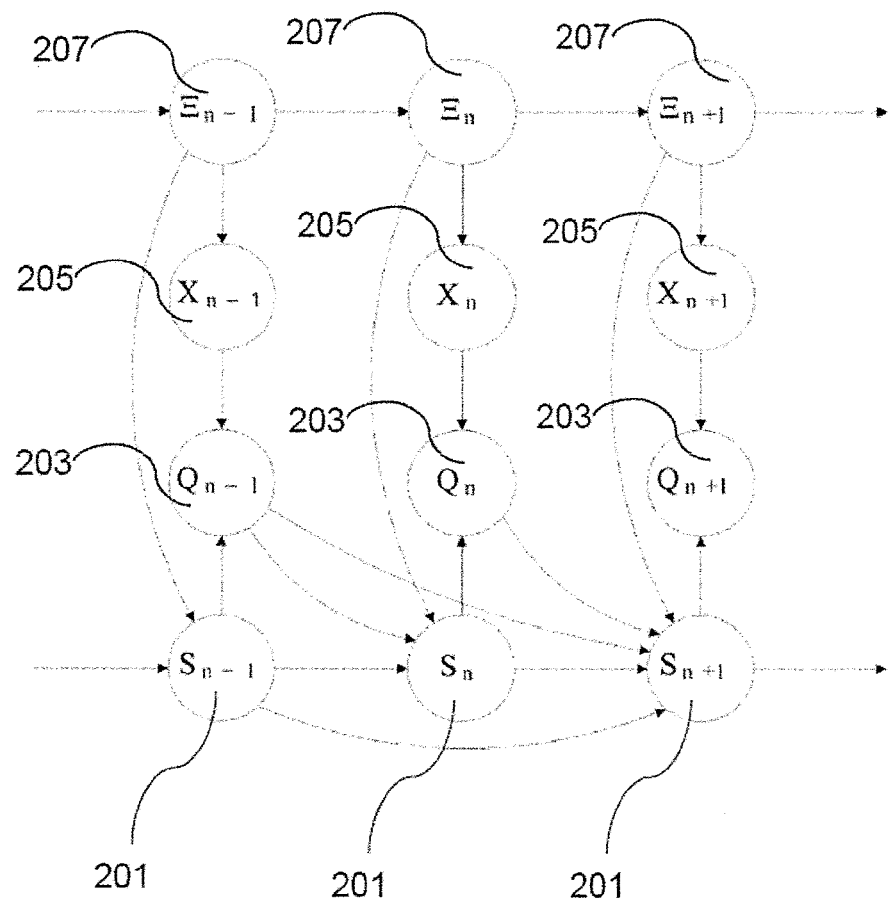
FIG. 2 shows a graphical model of (random) variables in a lossy coding system according to an implementation form.

FIG. 2 shows a plurality of states 201, 203, 205 and 207, wherein the code and the reconstruction are omitted for sake of clarity since they are determined by the quantization indices and the side information.

Throughout the description a sequence of random vectors are denoted as $X_1, \ldots, X_n$, by $X_1^n$. $p_{Q_i|Q_1^{i-1}}(q_i|q_1^{i-1})$ is used to denote the conditional probability mass function (p.m.f.) of a quantization index and abbreviated to $p(q_i|q_1^{i-1})$ when it causes no confusion. It is assumed that all random variables except the quantization indices have continuous alphabet and will be described with probability density functions (p.d.f.). However, switching to discrete alphabets does not influence the principles of this coding system. A p.d.f. is denoted by $f(\cdot)$ in a similar way as $p(\cdot)$ for a p.m.f.

Due to the chain structure, a variety of probabilistic properties can be calculated recursively, as described in C. M. Bishop, Pattern recognition and machine learning. Springer, 2006., Ch. 13. The concern is the conditional probability of a quantization index $Q_n$, given the past quantization indices $Q_1^{n-1}$, together with the current and the past side information $S_1^n$. To arrive there, an update recursion of the conditional probability distribution of the hidden state $\Xi_n$ is considered, based on which the conditional probability of $Q_n$ can be easily obtained.

From our model, the following conditional independencies that will be used in the derivation of the update recursion can be verified:

$$Q_n \perp \{Q_1^{n-1}, S_1^{n-1}, \Xi_{n+1}\} | \{\Xi_n, S_n\} \tag{2}$$

$$\Xi_n \perp \{Q_1^{n-1}, S_1^{n-1}\} | \Xi_{n-1} \tag{3}$$

$$S_n \perp \Xi_{n-1} | \{\Xi_n, Q_1^{n-1}, S_1^{n-1}\} \tag{4}$$

$$S_n \perp X_n | \Xi_{n-1} \tag{5}$$

Based on these independencies, an update recursion on the conditional probability distribution of a hidden state given all the past quantization indices and side information can be derived:

$$f(\xi_n | q_1^{n-1}, s_1^{n-1}) = \int_A f(\xi_n, \xi_{n-1} | q_1^{n-1}, s_1^{n-1}) d\xi_{n-1} = \tag{6}$$

$$\int_A f(\xi_n, \xi_{n-1} | q_1^{n-2}, s_1^{n-1}) \frac{p(q_{n-1}|\xi_n, \xi_{n-1}, q_1^{n-2}, s_1^{n-1})}{p(q_{n-1}|q_1^{n-2}, s_1^{n-1})} d\xi_{n-1} \propto$$

$$\int_A f(\xi_{n-1} | q_1^{n-2}, s_1^{n-1}) f(\xi_n | \xi_{n-1}) p(q_{n-1}|\xi_{n-1}, s_{n-1}) d\xi_{n-1},$$

where A denotes the alphabet from which the hidden states take values. Then incorporating the current side information, it can be found that $$f(\xi_n|q_1^{n-1},s_1^n) \propto f(\xi_n|q_1^{n-1},s_1^{n-1}) f(s_n|\xi_n,q_1^{n-1},s_1^{n-1}) \tag{7}$$

where it is assumed that the conditional probability distribution of the side information, $f(s_n|\xi_n,q_1^{n-1},s_1^{n-1})$, is a known function. Finally, the conditional probability of a quantization index can be obtained:

$$p(q_n|q_1^{n-1},s_1^n) = \int_A p(q_n|q_n,s_n) f(\xi_n|q_1^{n-1},s_1^n) d\xi_n \tag{8}$$

In both (6) and (8), the probability distribution of a quantization index given the hidden state and side information is needed and can be calculated by $$p(q_n | \xi_n, s_n) = \int_X p(q_n | x_n, s_n) f(x_n | \xi_n, s_n) dx_n \tag{9}$$

$$= \int_{x: q(x|s_n)=q_n} f(x_n | \xi_n) dx_n$$

The estimator iteratively updates the conditional probability distribution of the hidden states according to (6) and (7), and use (8) to obtain the conditional probability of the quantization indices for sequential entropy coding. In the following, it will be shown that together with the arithmetic coding, the method ensures that the expected rate to be within 2/N (bits/sample) from the optimal rate, when coding N samples.

The lowest expected rate for coding quantization indices with causal side information is given by the per-sample causally conditional entropy as described in G. Kramer, "Directed information for channels with feedback," Ph.D. dissertation, Swiss Federal Institute of technology, 1998:

$$H_N(Q_1^N \| S_1^N) = N^{-1} \sum_{i=1}^{N} H(Q_i | Q_1^{i-1}, S_1^i) \tag{10}$$

Arithmetic coding ensures the code length to be within 2 bits from the logarithm (base 2) of the product of the modeled probabilities for any input sequence as described in P. G. Howard and J. S. Vitter, "Arithmetic coding for data compression," Proceedings of the IEEE, vol. 82, no. 6, pp. 857-865, 1994.

Because the correct probabilistic model is used, the expected rate satisfies $$r \leq N^{-1} \int_{S^N} \sum_{q_1^N \in \Box^N} p(q_1^N | s_1^N) \tag{11}$$

$$f(s_1^N) \times \left(2 + \log_2 \prod_{i=1}^{N} p(q_i | q_1^{i-1}, s_1^i)\right) ds_1^N =$$

-continued $$N^{-1}\left(2 + \sum_{i=1}^{N} H(Q_1^i \mid Q_1^{i-1}, S_1^i)\right) = H_N(Q_1^N \| S_1^N) + \frac{2}{N},$$

where S denote the alphabet from which the side information takes values. Eq. (11) proves that the estimator is asymptotically optimal.

The exact update recursion involves integration over an arbitrary p.d.f. and hence is difficult to implement, especially when the hidden state has a high dimensionality. A solution is to parameterize the conditional probability distribution $f(\xi_n | q_1^{n-1}, s_1^{n-1})$ and recursively update the parameters. This may lead to an approximation. The approximator described in this description is the multivariate normal distribution:

$$f(\xi_n | q_1^{n-1}, s_1^{n-1}) \approx N(\xi_n; \mu_n, \Sigma_n) \quad (12)$$

of which the parameters are the mean $\mu_n$ and the covariance matrix $\Sigma_n$.

Using an approximate probability density, the expected rate is larger than the optimal rate, and the margin can be measured by the Kullback-Leibler (KL) divergence of the approximate probability density from the true one. Although the KL divergence of the Gaussian approximation on $f(\xi_n | q_1^{n-1}, s_1^{n-1})$ is not directly the loss in the rate of the whole coder, it is presumed that minimizing this KL divergence is an efficient way to reduce the final loss. For the Gaussian approximation, the parameters that achieve the minimum KL divergence are obtained by the so-called moment matching as described in C. M. Bishop, Pattern recognition and machine learning, Springer, 2006., Ch. 10.7, i.e., $$\mu_n = E\{\Xi_n | Q_1^{n-1}, S_1^{n-1}\} \quad (13)$$

$$\Sigma_n = E\{(\Xi_n - \mu_n)(\Xi_n - \mu_n)^T | Q_1^{n-1}, S_1^{n-1}\} \quad (14)$$

The Gaussian approximation for (6), together with (7) and (8), leads to an computationally feasible version of the estimator.

Many types of sources and side information satisfy the model assumptions and hence can benefit from the estimator. Here, a discrete-time linear stochastic system that generates a source signal $X_n$ is considered $$\Xi_n = A_n \Xi_{n-1} + B_n \Phi_n$$

$$X_n = C_n \Xi_n (X_n \in R^d, \Xi_n \in R^M) \quad (15)$$

where $\Phi_n$ is a white process. The matrices $A_n$, $B_n$ and $C_n$ are model parameters, which are assumed to be known a-prior. They can be derived from the mechanism of the system and/or by system identification techniques. The representation (15) yields an HMM model, with $\Xi_n$ being the hidden state. This HMM model possesses two special properties: 1) the relations among the hidden states and the observations are linear, and 2) no randomness is introduced to the observation from the corresponding hidden state. These will reduce the implementation complexity of the estimator. Despite of the specialties, the model is capable to describe a large scope of signals, including all ARMA processes as described in H. Akaike, "Markovian representation of stochastic processes and its application to the analysis of autoregressive moving average processes," Annals of the Institute of Statistical Mathematics, vol. 26, pp. 363-387, 1974. The way of constructing as such a linear stochastic system from an ARMA process is for example described in H. Akaike, "Markovian representation of stochastic processes and its application to the analysis of autoregressive moving average processes," Annals of the Institute of Statistical Mathematics, vol. 26, pp. 363-387, 1974. It is provided by this description a particular construction, which will be described in more detail later in the description. The method allows the source to be segments of the process in any dimensionality, thus is suitable for vector quantization.

Regarding the side information, two configurations may be considered. The first type of side information is independent of the current hidden state, given the past quantization indices and side information, i.e., $S_n \perp \Xi_n | \{S_1^{n-1}, Q_1^{n-1}\}$, which is referred to as Type-I side information. Examples of such side information include dither and closed-loop prediction. With Type-I side information, that (7) can be reduced to $$f(\xi_n | q_1^{n-1}, s_1^n) = f(\xi_n | q_1^{n-1}, s_1^{n-1}) \quad (16)$$

For the second type of side information it is assumed that $S_n \perp \{S_1^{n-1}, Q_1^{n-1}\} | \Xi_n$. In such category, the relation between $S_n$ and $\Xi_n$ can have various forms, which lead (7) to different expressions. Here, it is assumed that $S_n$ is linearly determined by $\Xi_n$, similarly as $X_n$:

$$S_n = D_n \Xi_n \quad (17)$$

It is referred to side information that satisfies (17) as Type-II side information, which can represent a wide-range of side information, e.g., open-loop prediction and delayed observation of the source. In the presence of Type-II side information $f(\xi_n | q_1^{n-1}, s_1^n)$ satisfies $$f(\xi_n | q_1^{n-1}, s_1^n) \propto \begin{cases} f(\xi_n | q_1^{n-1}, s_1^{n-1}) & D_n \xi_n = s_n \\ 0 & D_n \xi_n \neq s_n \end{cases} \quad (18)$$

When there is a combination of Type-I and II side information, each of them can be treated separately.

In the following, it is considered the approximate update recursion for each type of side information. It can be seen that when $f(\xi_n | q_1^{n-1}, s_1^{n-1})$ is approximated as a normal distribution, $f(\xi_n | q_1^{n-1}, s_1^n)$ is also a normal distribution. This is true for Type-I side information and also true for Type-II side information, in which case $f(\xi_n | q_1^{n-1}, s_1^n)$ lies on a hyperplane, i.e., $D_n \xi_n = s_n$, of $f(\xi_n | q_1^{n-1}, s_1^{n-1})$. In the following, $\mu_n$ and $\Sigma_n$ are used to denote the mean and the covariance matrix of $f(\xi_n | q_1^{n-1}, s_1^{n-1})$ as in (12); in addition $\tilde{\mu}_n$ and $\tilde{\Sigma}_n$ are used to denote the mean and the covariance matrix of $f(\xi_n | q_1^{n-1}, s_1^{n-1})$.

In the following, an Update recursion for Type-I side information will be described.

The working of the estimator for the lossy coding of a source is now derived, which is generated by a linear stochastic system, with Type-I side information.

It is ready to see that for the linear stochastic system, the update on the mean of the Gaussian approximator, i.e. (13), becomes $$\mu_n = \int_{R^M} E\{\Xi_n | \Xi_{n-1} = \xi_{n-1}\} \times \quad (19)$$

$$T\left(\xi_{n-1}; \tilde{\mu}_{n-1}, \tilde{\Sigma}_{n-1}, \Omega_{n-1}\right) d\xi_{n-1}$$

$$= A_n \bar{\mu}_{n-1}$$

where $\bar{\mu}_{n-1}$ is the mean of a truncated normal distribution, i.e., $N(\xi_{n-1}; \tilde{\mu}_{n-1}, \tilde{\Sigma}_{n-1})$ truncated by the region:

$$\Omega_{n-1} = \{\xi : q(C_n \xi | s_{n-1}) q_{n-1}, \xi \in R^M\} \quad (20)$$

$T(x;\mu,\Sigma,\Omega)$ are used to denote a truncated normal distribution with $N(x;\mu,\Sigma)$ being the original normal distribution and $\Omega$ being the truncation region, i.e., $$T(x;\mu,\sum,\Omega) = \begin{cases} \dfrac{N(x;\mu,\sum)}{\int_\Omega N(\tau;\mu,\sum)d\tau} & x \in \Omega \\ 0 & x \notin \Omega \end{cases} \quad (21)$$

Similarly, the update on the covariance matrix, i.e. (14), becomes $$\sum_n = \int_{R^M} E\{(\Xi_n - \mu_n)(\Xi_n - \mu_n)^T \mid \Xi_{n-1} = \xi_{n-1}\} \times \quad (22)$$

$$T\left(\xi_{n-1}; \tilde{\mu}_{n-1}, \tilde{\sum}_{n-1}, \Omega_{n-1}\right) d\xi_{n-1}$$

$$= B_n B_n^T + A_n \sum\nolimits_{n-1} A_n^T$$

where $\tilde{\Sigma}_{n-1}$, is the covariance matrix of the truncated normal distribution.

For Type-I side information, since (16), $\tilde{\mu}_n = \mu_n$ and $\tilde{\Sigma}_n = \Sigma_n$, which, together with (19) and (22) complete the update recursion. Finally, the probability distribution of a quantization index, i.e. (8), can be calculated which in the context of the linear statistic system becomes $$p(q_n \mid q_1^{n-1}, s_1^n) \int_{x:q(x \mid s_n) = q_n} N(x_n; C_n \tilde{\mu}_n, C_n \tilde{\Sigma}_n C_n^T) dx_n \quad (23)$$

It can be seen that the method needs the calculation of the mean and the variance of truncated normal distribution. For univariate truncated normal distribution, they can be calculated analytically. In the case of high dimensionality, one can sample the truncated normal distribution as described in Y. Huang, T. Ghirmai, and P. M. Djuric, "The rejection Gibbs coupler: A perfect sampling algorithm and its application to truncated multivariate Gaussian distributions," in Proc. 11th IEEE Signal Processing Workshop Statistical Signal Processing, 2001, pp. 42- and one can estimate the mean and the covariance matrix. However, the sampling over a high dimensional space causes significant computational complexity.

Here, a method that can reduce the computational effort of the calculation for the estimator will be described. Since $C_n$, may not have full column rank, the truncation is conducted only on a subspace of the hidden state. Identifying this subspace can reduce the computational complexity. The singular value decomposition (SVD) on $C_n$ is performed $$C_n = U_{C,n}[\Lambda_{C,n}\ 0] V_{C,n}^T \quad (24)$$

and $V_{C,n}^T \Xi_n$ is a new hidden state, with which a new state-space representation can be obtained by performing a similarity transformation as described in P. Stoica and R. L. Moses, Introduction to Spectral Analysis. Prentice Hall, 1997, Ch. 3.8 to the matrices in (15):

$$A_n \leftarrow V_{C,n}^T A_n V_{C,n-1}$$

$$B_n \leftarrow V_{C,n}^T B_n$$

$$B_n \leftarrow [U_{C,n}\Lambda_{C,n}\ 0] \quad (25)$$

The truncation region then becomes $\{\lambda: q(U_{C,n}\lambda|s_n)=q_n, \lambda \in R^d\} \times R^{M-d}$. To obtain the mean and the covariance matrix of a truncated normal distribution with truncation region of this kind, which is called semi-truncated normal distribution, the mean and the covariance matrix of the first d variates are calculated and the extension technique described in S. Kotz, N. Balakrishnan, and N. L. Johnson, Continuous Multivariate Distributions Models and Applications, 2nd ed. John Wiley & Sons, 2000, vol. 1., Ch. 45.10 may be applied.

In the following, an update recursion for Type-II side information will be described.

As discussed, in the presence of Type-II side information, an additional attention has to be paid to the calculation of $f(\xi_n | q_1^{n-1}, s_1^n)$. Specifically, its mean $\tilde{\mu}_n$ and covariance matrix $\tilde{\Sigma}_n$, which equals the conditional mean and covariance matrix of $N(\xi_n; \mu_n, \Sigma_n)$ given $D_n \xi_n = s_n$ may be calculated. A way to calculate the conditional mean and covariance of normal distribution with this type of condition is provided in more detail later in the description (see Appendix B). Upon obtaining $\tilde{\mu}_n$ and $\tilde{\Sigma}_n$, the remainder and the update recursion is the same as in (19) and (22), and the probability distribution of a quantization index is calculated in the same manner as in (23).

The method that enhances the efficiency of computing the mean and covariance matrix of truncated normal distribution for Type-I side information can also be used in the case of Type-II side information. In addition to the modification to the state-space representation as in (25), the side information (17) also needs to be changed with $D_n$, becoming $$D_n \leftarrow D_n V_{C,n} \quad (26)$$

Now, the estimator for linear stochastic system with a combination of Type-I and Type-II side information is summarized by the pseudo-code in Tab. I.

Table I shows an implementation form of an estimator for linear stochastic system with a combination of Type-I and Type-II side information.

TABLE I a) Input: $q_n$, $s_n$, $A_n$, $B_n$, $C_n$ and $D_n$ (optional), (n = 1,2, ..., N).
b) Output: $p(q_n|q_1^{n-1}, s_1^n)$.
c) Procedures
  1. Set $\mu_0$, $\Sigma_0$, $\tilde{\mu}_0$ and $\tilde{\Sigma}_0$.
  2. Set $\tilde{\mu}_0 = \mu_0$ and $\tilde{\Sigma}_0 = \Sigma_0$
  3. For n = 1,2, ..., N do the following:
  4. Perform SVD on $C_n$ according to (24).
  5. Transform $A_n$, $B_n$, $C_n$ according to (25).
  6. Transform $D_n$ according to (26) (optional).
  7. Update $\mu_n$ according to (19).
  8. Update $\Sigma_n$ according to (22).
  9. If $D_n$ is not available, let $\tilde{\mu}_n = \mu_n$, and $\tilde{\Sigma}_n = \Sigma_n$, otherwise calculate $\tilde{\mu}_n$ and $\tilde{\Sigma}_n$ according to Appendix B.
  10. Calculate $p(q_n|q_1^{n-1}, s_1^n)$ according to (23).
  11. Calculate the mean and the covariance matrix of
    $T(\lambda; \tilde{\mu}_{n,d}, \tilde{\Sigma}_{n,d}, \Omega_{n,d})$, where $\tilde{\mu}_{n,d}$ denotes the first d rows of $\tilde{\mu}_n$,
    $\tilde{\Sigma}_{n,d}$
    denotes the upper-left d × d submatrix of $\tilde{\Sigma}_n$, and
    $\Omega_{n,d} = \{\lambda: q(U_{C,n}\lambda|s_n) = q_n, \lambda \in R^d\}$.
  12. Calculate $\tilde{\mu}_n$ and $\tilde{\Sigma}_n$ based on the result of 11).

The method can be applied to various lossy coding scenarios. Here, rate-distortion optimal lossy coding methods for Gaussian ARMA processes are considered. The reason of choosing rate-distortion optimal coders is that the performances of such coders are analyzable, so it can be judged whether the estimator can facilitate these coders to achieve their theoretical performances. Two embodiments may be considered in the following. In the first embodiment, only Type-I side information is used, and in the second one, Type-II side information is also included.

Figure 3:
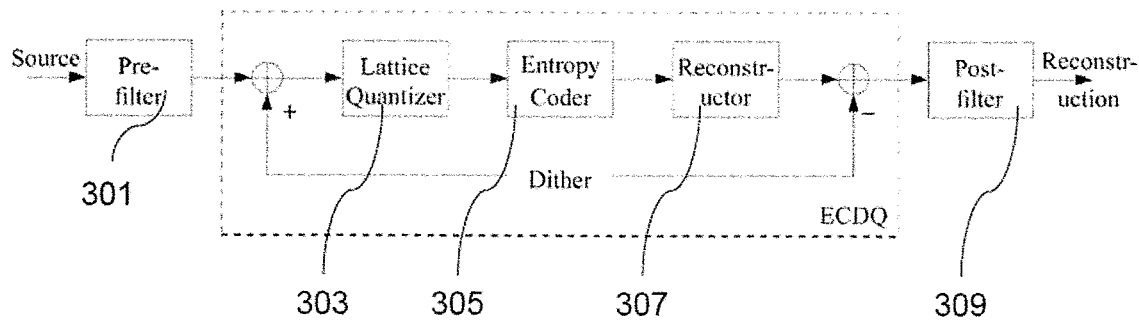
FIG. 3 shows a diagram of a coder according to an implementation form.

According to an implementation form, it is considered coding a Gaussian ARMA process with a pre- and post-filtered, entropy coded dithered lattice quantizer (ECDQ) as described in R. Zamir and M. Feder, "Information rates of pre/post-filtered dithered quantizers," IEEE Transactions on Information Theory, vol. 42, no. 5, pp. 1340-1353, 1996, which is referred to as Coder-I and further shown in FIG. 3. The source is first processed by a pre-filter 301, whose frequency response, $\alpha(\omega)$ satisfies $$|\alpha(\omega)|^2 = 1 - \frac{\min(P_X(\omega), \theta)}{P_X(\omega)} \quad (27)$$

where $P_X(\omega)$ denotes the power spectral density (PSD) of the source signal and $\theta$ denotes the per-dimension second moment of the lattice used in the ECDQ, which is also the power of the quantization noise caused by the ECDQ. The pre-filtered signal enters the ECDQ in the form of d-tuple blocks. For each block, a dither, $S_n$, is generated and added to the input block. The dither is drawn from a uniform distribution over the basic lattice cell, and the drawing is independent of the input and the dither for other blocks. A lattice quantizer 303 is used to produce the quantization indices, $Q_n$, which are then coded with an entropy coder 305. When coding an infinitely long sequence, the minimum achievable rate (bits/sample) of an ECDQ is the per-sample entropy rate of the quantization indices given the dither, i.e., $$r_{opt} = \frac{1}{d} H_\infty(Q \mid S) \\ = \lim_{N \to \infty} \frac{1}{dN} H(Q_1^N \mid S_1^N) \quad (28)$$

The estimator, together with the arithmetic coding, is used as the entropy coder 305 in Coder-I and is expected to approach the optimal rate. For reconstruction of the source, a lattice decoder 307. also referred to as a reconstructor, may be used. Then the dither, $S_n$, is subtracted from the decoded signal. The resulted signal is finally fed into a post-filter 309, whose frequency response $\beta(\omega)$ is the conjugate of $\alpha(\omega)$.

Figure 4:
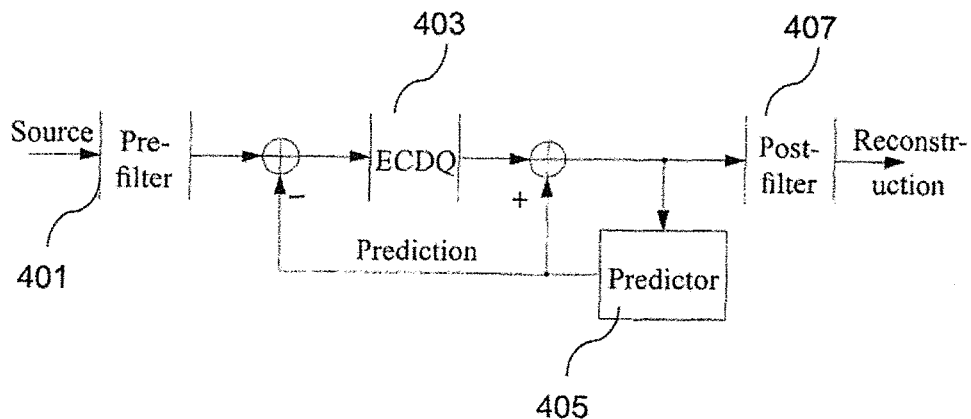
FIG. 4 shows a block diagram of a coder according to an implementation form.

For comparison, a differential pulse-coded modulation (DPCM) system is considered with the pre- and post-filtered ECDQ as described in R. Zamir, Y. Kochman, and U. Erez, "Achieving the Gaussian rate-distortion function by prediction," IEEE Transactions on Information Theory, vol. 54, no. 7, pp. 3354-3364, 2008, which is referred to as Coder-II and shown in FIG. 4. The system comprises a pre-filter 401 and an ECDQ 403. In Coder-II, an optimal linear predictor 405, which minimizes the MSE between the pre-filtered source and the prediction, is used. Due to the use of prediction, it is usually assumed that the prediction error is a white process. To be consistent with this convention, the entropy coder in Coder-II is implemented by a arithmetic coding, which is based on a probabilistic model that assumes independence among the quantization indices. This entropy coding is referred to as independent coding. The independent coding leads to a rate equal to the scalar entropy of the quantization index given the dither. Furthermore a post-filter 407 are present.

Coder-I and II possess the following characteristics according to some implementation forms:

The entropy rate of the quantization indices given the dither is the same for the Code-I and II under the same mean squared error (MSE) between the source and its reconstruction. This means that if proper entropy coders are used, Coder-I and II yield the same rate-distortion performance. In addition, the optimal rate for both coders is bounded from the rate-distortion function of the source, R(D), up to an offset from it, which is due to the non-optimal shape the lattice:

$$R(D) \le r_{opt}^{I,II}(D) \le R(D) + \frac{1}{2}\log 2\pi eG \quad (29)$$

where G denotes the normalized second moment of the basic lattice cell, which approaches $1/2\pi e$ for certain lattice when the dimensionality goes to infinity. So Code-I and II are both asymptotically rate-MSE optimal. It is also noted that for small D, the optimal rate is close to the upper bound, and for large D, it is close to the lower bound.

In Coder-II, if the ECDQ is replaced by an AWGN channel, which can be asymptotically valid with increasing lattice dimensionality, the scalar entropy of the quantization index given the dither equals the entropy rate of the quantization indices given the dither. This means that if the ECDQ in Coder-I and II uses the optimal lattice of infinite dimensionality, the same rate-distortion performance is achieved by Coder-I with a proper entropy coder that counts in the dependencies among the quantization indices and by Coder-II with an entropy coder that assumes independence among the indices. However, it is contradictory that Coder-II does not facilitate the use of high dimensional lattices, since the prediction operates in a closed loop and thus requires instant quantization.

It can be seen that the condition, under which independent coding can lead to optimality, is rather strict. It is, however, often underplayed. It is ubiquitous to use prediction followed by a coder that assumes independence of the indices resulted from quantizing the prediction error. Due to the dependencies among the quantization indices, Coder-II with independent coding cannot achieve $r_{opt}^{I,II}(D)$.

Using the estimator, Coder-I can achieve the optimal rate. However, because of the Gaussian approximation (12), the optimal rate may not be exactly achieved. It is also interesting to investigate the efficiency of the Gaussian approximation in the method. It is noted that Gaussian approximation is also used in the Coder-II, which assumes the prediction error to follow a normal distribution. In fact, the Gaussian approximation is expected to have only slight influence, because at high rate, when the quantization indices represent the source with high accuracy, $f(\xi_n | q_1^{n-1}, s_1^{n-1})$ is close to the conditional p.d.f. of $\Xi_n$ given $X_1^{n-1}$, which is Gaussian, and at low rate, when the quantization indices do not provide much information to $\Xi_n$, $f(\xi_n | q_1^{n-1}, s_1^{n-1})$ is close to the marginal p.d.f. of $\Xi_n$, which is also Gaussian.

The pre-filter 301 and 401 and post-filter 309 and 407, since they form a conjugate pair, cannot be causal at the same time. To make the systems feasible, both the pre-filters 301 and 401 and the post-filters 309 and 407 may be a finite impulse response (FIR) filter, and the impulse responses be the reverse ordered sequence of each other. Then there is a constant time delay of the reconstruction from the source, which can be easily compensated.

A scalar quantizer for the ECDQ can be modified, which is a necessity for Coder-II and also makes Coder-I a practical scheme. The source is a Gaussian ARMA(16,16) process, of which the PSD is shown in FIG. 5. The abscissa shows the frequency in rad. The ordinate shows the PSD in dB. The order of the pre- and post-filter can be limited to be 32, which makes the input to the ECDQ an ARMA(16,48) process, from which the linear stochastic system are obtained using the uni-dimensional version of the method described later. It is also noted that the optimal predictor in Coder-II, which in principle has infinite order, is limited to 32-th order in the following.

As the result, FIG. 6 depicts the rate-MSE performance of Coder-I with the estimator, reference numeral 601, that of Coder-II with independent coding, reference numeral 603, together with the upper, reference numeral 605, and the lower bounds, reference numeral 607, of the optimal rate of Coder-I and II. The abscissa shows the MSE in dB. The ordinate shows the Rate in bits per sample. It can be seen that Coder-I with the estimator is more efficient than Coder-II with independent coding. It is noted that the estimator can also be applied in Coder-II, which can make it as efficient as Coder-I. However, this was not considered in this configuration for sake of clarity.

From the result, is has been found that the Gaussian approximation is appropriate in the sense that Coder-I's rate-distortion profile is bounded in the area where the optimal performance should lie and follows the asymptotic behaviors of the optimal rate-distortion characteristic, i.e., being close to the upper bound at low distortion and being close to the lower bound at high distortion.

According to an implementation form, it is considered coding a Gaussian ARMA process with side information that is one-step delayed version of the source. Since the past samples are available for the coding of the current sample, it is easy to see that an optimal coding structure is to perform prediction and code the prediction error. Unlike the prediction of Code-II in embodiment I, the optimal prediction in this case guarantees the independence among the prediction error. In particular, the optimal prediction error is a white Gaussian process with power given by the Kolmogorov's formula as described in P. J. Brockwell and R. A. Davis, Time Series: Theory and Methods, 2nd ed. Springer, 1991:

$$\sigma_\infty^2 = \exp\left(\frac{1}{2\pi}\int_{-\pi}^{\pi} \ln(P_X(\omega))d\omega\right) \qquad (30)$$

To code the prediction error, a pre- and post-scaled ECDQ, as described in R. Zamir and M. Feder, "Information rates of pre/post-filtered dithered quantizers," IEEE Transactions on Information Theory, vol. 42, no. 5, pp. 1340-1353, 1996, which asymptotically reaches the rate-distortion optimality, can be applied. The coder is referred to as Coder-III and shown in FIG. 7 comprising a predictor 701 and an ECDQ 703, where $$\alpha = \sqrt{1 - \frac{\theta}{\sigma_\infty^2}} \qquad (31)$$

The estimator may be used for the entropy coding in Coder-III, for which the algorithm is reduced to independent coding. In the following, it is considered another coding scheme, which avoids the prediction before quantization and applies the estimator to capture the dependencies in the indices resulted from quantizing the source directly. The avoidance of prediction is needed in some practical lossy coding scenarios, e.g., when there is computation limitation for the quantizer or when the side information, which the prediction is based on, is not available to the quantizer.

Figure 7:
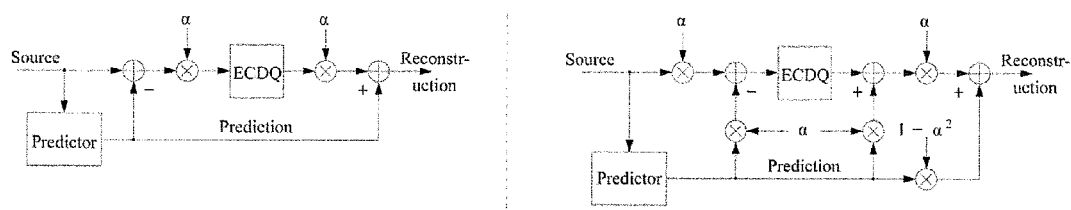
FIG. 7 shows a block diagram of a coder and its equivalence according to an implementation form.
Figure 8:
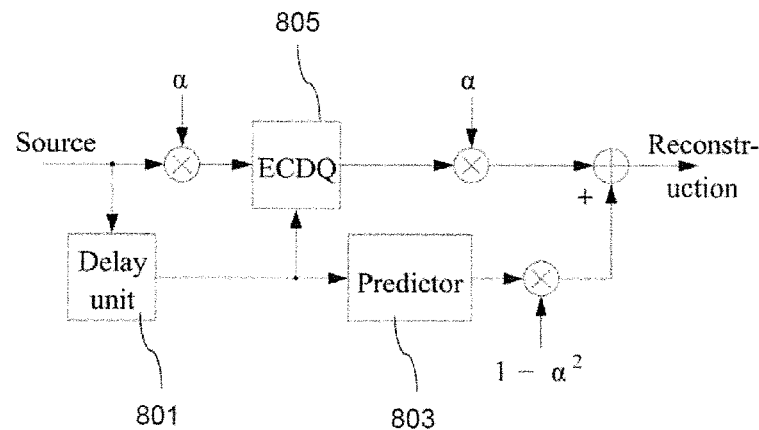
FIG. 8 shows a block diagram of a coder according to an implementation form.

To obtain the alternative scheme, it is first shown a coder that is equivalent to Coder-III in FIG. 7. Removing the subtraction and addition of a same quantity aside ECDQ leads to Coder-IV as shown in FIG. 8 that is equivalent to Coder-III, in terms of rate-MSE performance. It is seen that Coder-IV does not apply any prediction before quantizing the source. Therefore, the quantization indices are not independent. The estimator is applied to Coder-IV and is expected to endow Coder-IV the same performance as Coder-III with independent coding. Coder-IV has two side information, one is the dither, as in Coder-I, and the other is the delayed source sample, which is a Type-II side information.

In FIG. 8, a system with a delay unit 801, a predictor 803 and an ECDQ 805 is shown.

To predict the rate-MSE performance, it is noted that the optimal achievable rate-distortion performance of Coder-III, thus also that of Coder-IV, satisfies, as described in R. Zamir and M. Feder, "Information rates of pre/post-filtered dithered quantizers," IEEE Transactions on Information Theory, vol. 42, no. 5, pp. 1340-1353, 1996:

$$\frac{1}{2}\log\frac{\sigma_\infty^2}{D} \le r_{opt}^{III,IV}(D) \le \frac{1}{2}\log\frac{\sigma_\infty^2}{D} + \frac{1}{2}\log 2\pi eG \qquad (32)$$

Here, a scalar quantizer is considered for the ECDQ. The same source as in embodiment I is used. To model the source and the second side information altogether, is applied on the source ARMA model, with a modification on the dimensionality of the states, which in this case should satisfy M≥max{L, K+2}. Then the source and the second side information can be written, respectively, as $$X_n = \alpha[b_0 \ldots b_K 0 \ldots]_{1 \times M} \Xi_n \qquad (33)$$

$$S_n = \alpha[0\ b_0 \ldots b_K 0 \ldots]_{1 \times M} \Xi_n \qquad (34)$$

Figure 9:
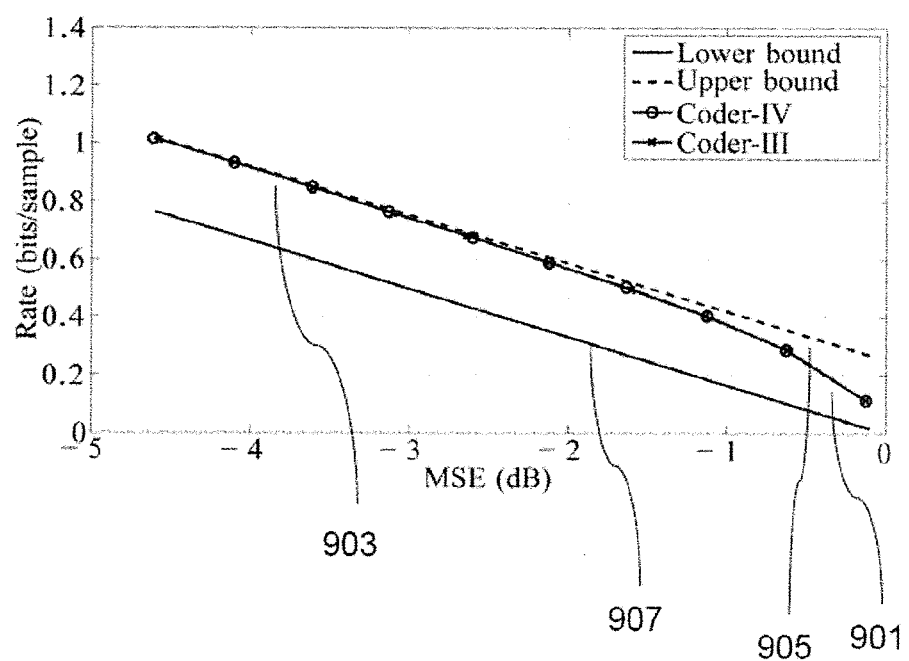
FIG. 9 shows the rate (bits/sample) over the MSE in db according to an implementation form.

The rate-MSE behavior of Coder-IV with the estimator, that of Coder-III with independent coding, together with the upper and the lower bounds of the optimal rate are illustrated in FIG. 9.

In FIG. 9, the abscissa shows the MSE in db. The ordinate shows the rate in bits per sample. Reference numeral 901 depicts the rate-MSE performance of Coder-IV with the estimator. Reference numeral 903 depicts the one of Coder-III with independent coding. Reference numeral 905 depicts the upper bounds and the reference numeral 907 depicts the lower of the optimal rate of Coder-III and IV.

It can be seen that the Coder-IV with the estimator is as efficient as Coder-III, although it avoids the use of prediction for decorrelation. It is noted that Coder-IV uses a prediction for the reconstruction to reduce the MSE.

Sequential entropy coding of a sequence with a proper model of the conditional probability for each sample is an efficient way to achieve the optimal rate. In lossy coding systems, such coding strategy is preferable for the lossless coding of the quantization indices. The estimator is used for a lossless coding method that entropy encodes the indices in a sequential manner. The estimator calculates the conditional probability distribution of quantization indices both efficiently and accurately. In addition, the estimator is general and can be used in a large scope of lossy coding scenarios.

In the following, a construction of state-space representation for ARMA processes will be described according to an implementation form.

APPENDIX A

A one-dimensional ARMA(L,K) process $Y_n$ is considered, which is described by the following filtering form:

$$Y_n + a_1 Y_{n-1} + \ldots + a_L Y_{n-L} = b_0 W_n + b_1 W_{n-1} + \ldots + b_K W_{n-K} \qquad (35)$$

where $W_n$ is a white process with unit power. In the method, the hidden states in the linear stochastic system are chosen to be the memory of the unit delays in the Direct Form II realization of the ARMA filtering. First, a uni-dimensional case is considered. Taking a sample of the ARMA process to be an observation, i.e., $X_n = Y_n$, the number of the delay units needed, M, which is also the dimensionality of the hidden state, should be greater or equal to max{L,K+1}. The $A_n$, $B_n$ and $C_n$ in (15) can be embodied to be time-invariant matrices as the following:

$$A_{1,M} = \begin{bmatrix} a_1 & \cdots & a_L & 0 & \cdots \\ 1 & 0 & \cdots & 0 & \cdots \\ 0 & 1 & \cdots & 0 & \cdots \\ \vdots & \vdots & \ddots & \vdots & \vdots \end{bmatrix}_{M \times M} \quad (36)$$

$$B_{1,M} = [1 \ 0 \ \cdots]^T_{1 \times M} \quad (37)$$

$$C_{1,M} = [b_0 \ \cdots \ b_K \ 0 \ \cdots]_{1 \times M} \quad (38)$$

High dimensional situation may be considered. In order to make $X_n$, to consists of d consecutive samples of $Y_n$, the number of the unit delays can be increased to $M \geq \max\{L, K+d\}$ and let $C_n$ in (15) be $$C_{d,M} = \begin{bmatrix} b_0 & \cdots & b_K & 0 & \cdots & \cdots \\ 0 & b_0 & \cdots & b_k & 0 & \cdots \\ \vdots & \ddots & \ddots & \ddots & \ddots & \vdots \end{bmatrix}_{d \times M} \quad (39)$$

Since $X_n$ and $X_{n+1}$ are d samples apart, the hidden state needs to be updated every d filtering operations. It is straightforward to show that the hidden state is updated by letting $A_n$ and $B_n$ in (15) be $$A_{d,M} = A_{1,M}^d \quad (40)$$

$$B_{d,M} = B_{1,M}[I \ A_{1,M} \ A_{1,M}^2 \ \cdots \ A_{1,M}^{d-1}] \quad (41)$$

In the following, a conditional mean and covariance matrix of normal distribution will be described according to an implementation form.

APPENDIX B

Let T be a random vector with normal distribution $N(t; \mu_t, \Sigma_t)$. We would like to calculate the conditional mean and covariance matrix of T given DT=c. To this purpose, we do SVD on D:

$$D = U_D[\Lambda_D \ 0]V_D^T \quad (42)$$

Let $S = V_D^T T$. It is easy to see that S the normal distribution $N(s; \mu_s, \Sigma_s)$ with $\mu_s = V_D^T \mu_t$ and $\Sigma_s = V_D^T \Sigma_t V_D$. S, $\mu_s$ and $\Xi_s$ may be segmented as $$S = \begin{bmatrix} X \\ Y \end{bmatrix}, \mu_s$$
$$= \begin{bmatrix} \mu_x \\ \mu_y \end{bmatrix},$$

$$\sum_s = \begin{bmatrix} \sum_{xx} & \sum_{xy} \\ \sum_{xy}^T & \sum_{yy} \end{bmatrix}.$$

The condition, i.e. DT=c, becomes $U_D \Lambda_D X = c$, or equivalently $X = \Lambda_D^{-1} U_D^T c$. Here we assume D to be full row rank. It is known that given $X = \Lambda_D^{-1} U_D^T c$, the mean and covariance matrix of S are $$\mu_{s|x} = \begin{bmatrix} \Lambda_D^{-1} U_D^T c \\ \mu_y + \sum_{xy}^t \sum_{xx}^{-1} (\Lambda_D^{-1} U_C^T c - \mu_x) \end{bmatrix} \quad (43)$$

$$\sum_{s|x} = \begin{bmatrix} 0 & 0 \\ 0 & \sum_{yy} - \sum_{xy}^T \sum_{xx}^{-1} \sum_{xy} \end{bmatrix} \quad (44)$$

Finally, the conditional mean and covariance matrix of T given DT=c are $\mu_{t|Dt} = V_D \mu_{s|x}$ and $\Sigma_{t|Dt} = V_D \Sigma_{s|x} V_D^T$.

Figure 10:
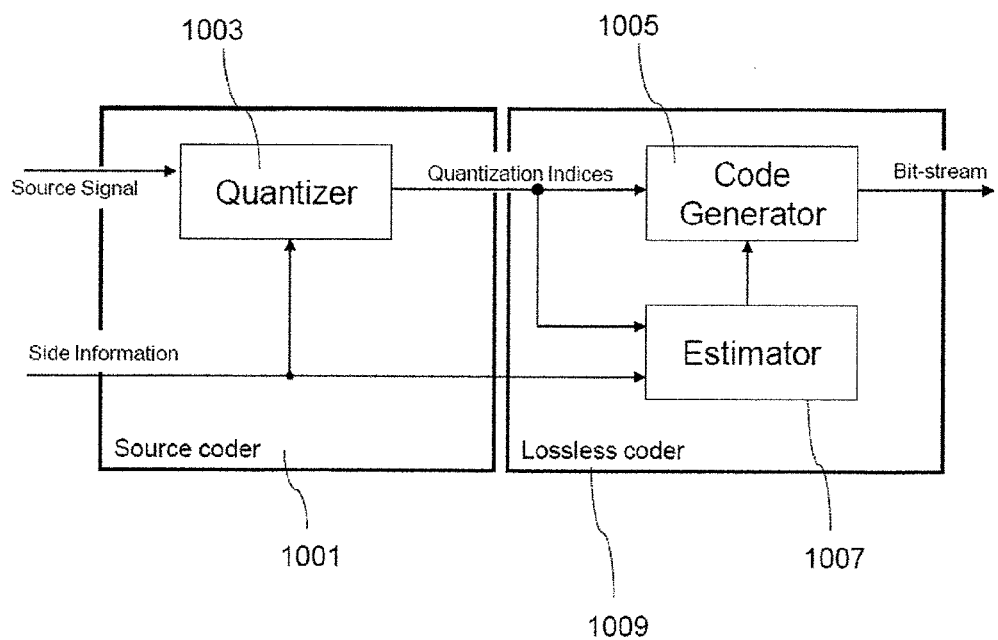
FIG. 10 shows a block diagram of a lossy coding system according to an implementation form.

FIG. 10 shows a source coder 1001, which may be a generic source coder, e.g. a transform coder, a predictive coding scheme (closed-loop prediction or open-loop prediction). The source coder 1001 may include a quantizer 1003, e.g. a lattice quantizer, a dithered quantizer or a uniform scalar quantizer.

Furthermore, a code generator 1005 is provided, performing for example code generation. The code generator 1005 may be an arithmetic encoder. The code generator 1005 may use estimates of probabilities of the quantization indices for an efficient performance.

In addition, an estimator 1007 is provided, which provides estimates of quantization index probabilities for the code generator utilizing available side information, e.g. prediction outcome, dither realization or previously coded signal. The estimator 1007 is used for estimating the probability distribution of quantization indices.

Further, a lossless coder 1009 is provided. The lossless code 1009 includes the estimator 1007 and the code generator 1005, which may be also denoted as a code generation unit.

Figure 11:
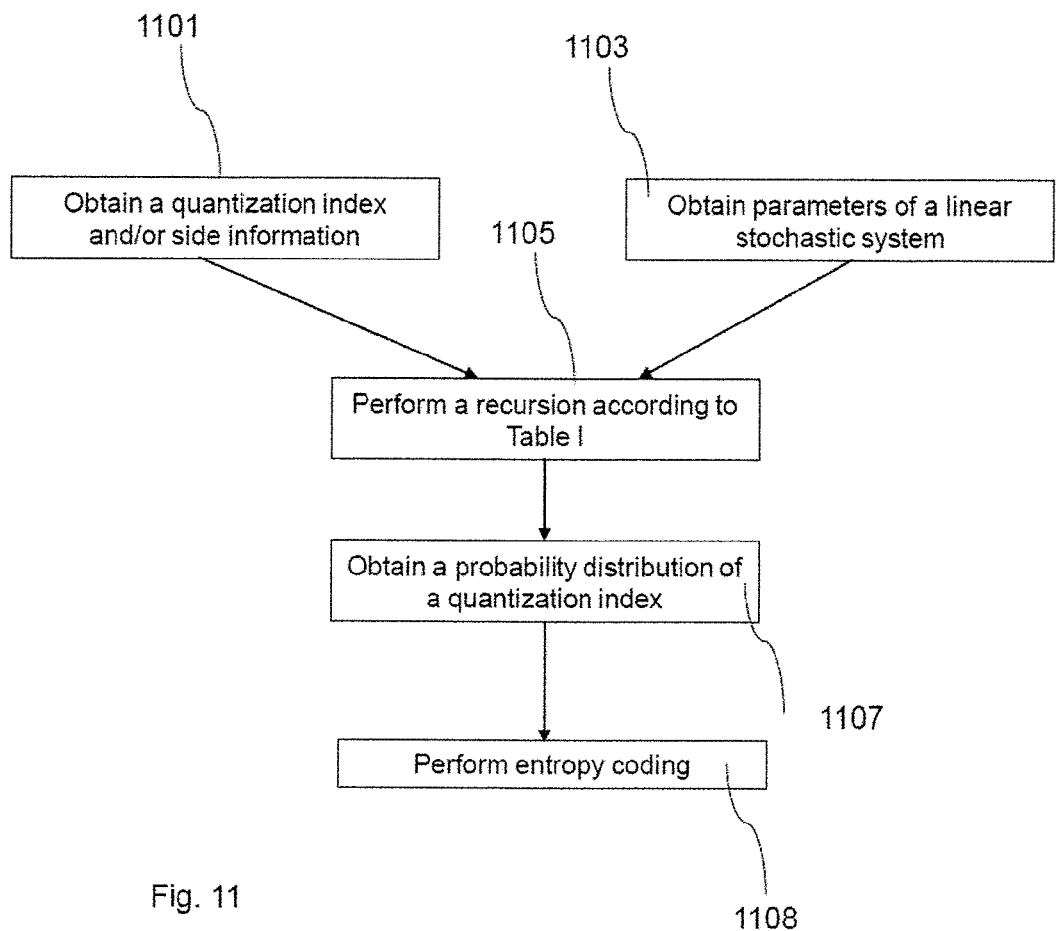
FIG. 11 shows a diagram of a coding method according to an implementation form.

FIG. 11 shows a diagram of a further embodiment of the method according to the invention. In Step 1101a quantization index and side information are obtained. In Step 1103 parameters of a linear stochastic system are obtained. In Step 1105 a recursion according to the aforementioned table I performed. In Step 1107 a probability distribution of a quantization index is obtained. In Step 1108 entropy coding is performed.

According to some implementations, the following steps may be performed in the aforementioned method:

Perform recursive updates of a probability distribution of a quantization index using a recursion described above with an approximation described above by using a representation of the quantization scheme that involves a linear stochastic system described above.

Figure 12:
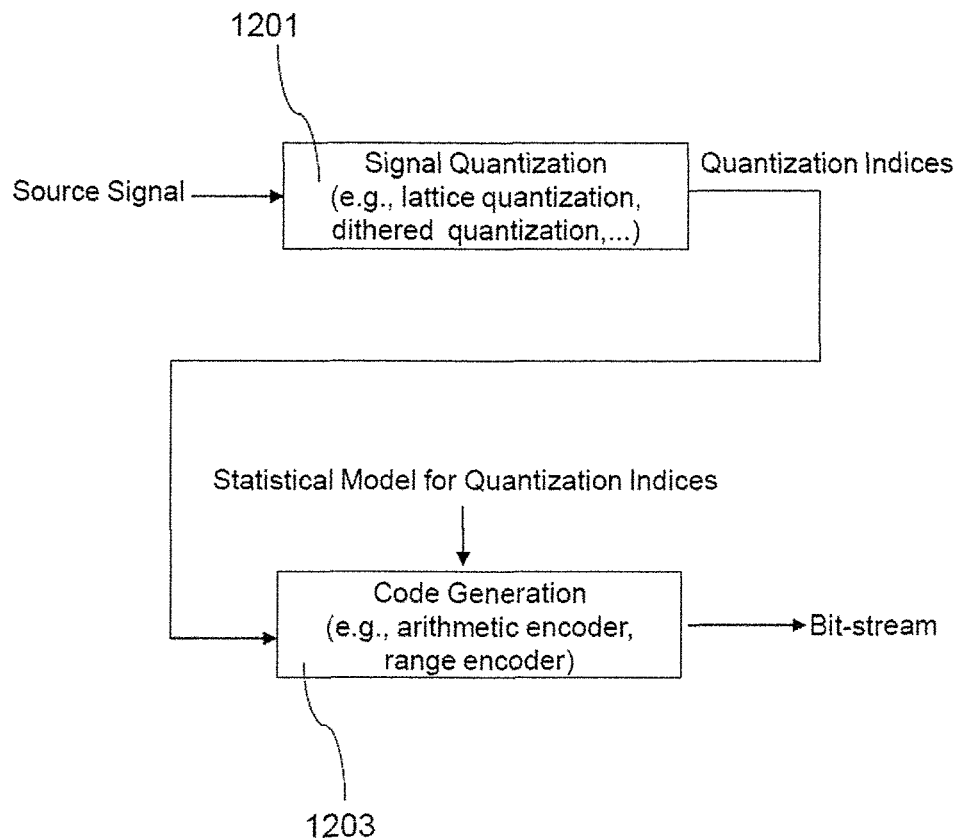
FIG. 12 shows a diagram of a coding method according to an implementation form.

FIG. 12 shows a diagram of a coding method comprising signal quantization 1201 and code generation 1203. The source, e.g., audio, image, video, etc., of the signal generates a sequence of samples that are subject to quantization 1201. For quantization 1201, any quantizer may be used that facilitates variable-rate coding (VBR), for example lattice quantizer, uniform scalar quantizer, quantizer with dithering, quantization in predictive framework, etc. The quantizer 1201 maps a source sample to a quantization index and outputs a sequence of quantization indices that must be converted to a binary code. There are known code generation methods that convert a sequence of indices into a bit-stream given probabilities or probability distribution of the quantization indices. The code generation 1203 outputs a bit-stream. Thereby, a low-complexity method for estimation of index probability distribution for the purpose of efficient code generation is provided.

Figure 13:
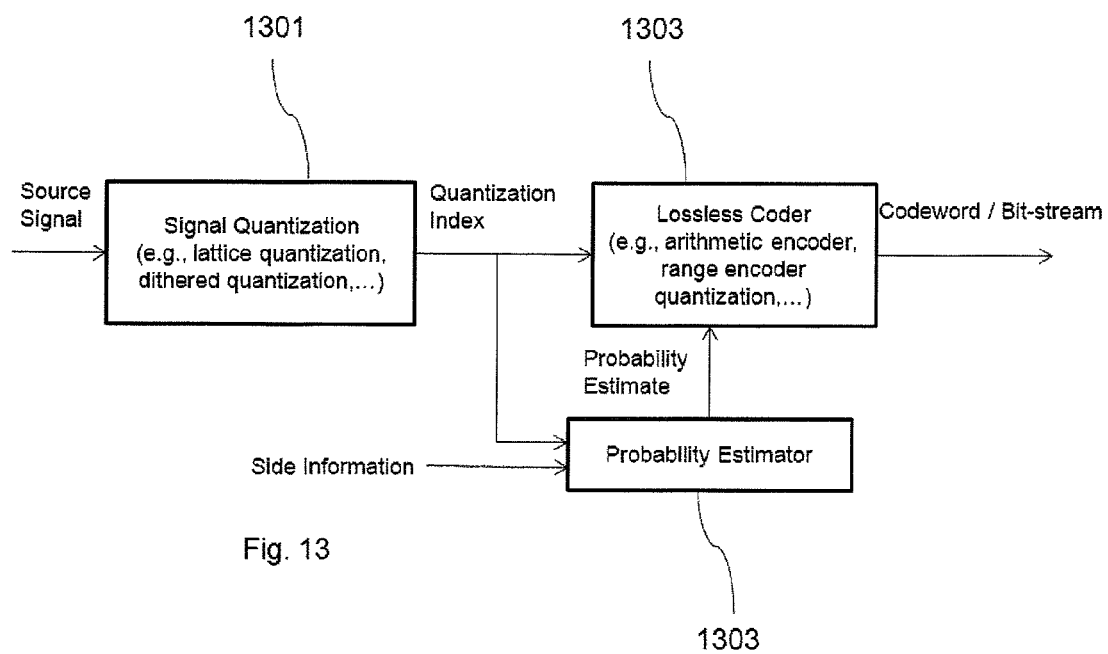
FIG. 13 shows a block diagram of a coder according to an implementation form.

FIG. 13 shows a block diagram of a coder comprising a quantizer 1301 for signal quantization, e.g. lattice quantization, a lossless coder 1303, e.g. an arithmetic coder, and a probability estimator 1305 receiving quantization indices, side information, and providing a probability distribution of a quantization index to the lossless coder 1303.

It is of interest to represent the quantization index by the shortest possible codeword that facilitates decoding operation. Thus, a variable bit-rate (VBR) coding scenario may be considered, where the codeword length depends on the probability of the quantization index that may be obtained upon the basis of a probability distribution of quantization indices. For example, if some values of the quantization index are less-likely to occur, it is more efficient to assign these values with longer code words and use the shortest code words for index values that are more likely to appear. Such coding strategy can be implemented if an index probability distribution can be provided to the lossless coder 1303.

Figure 14:
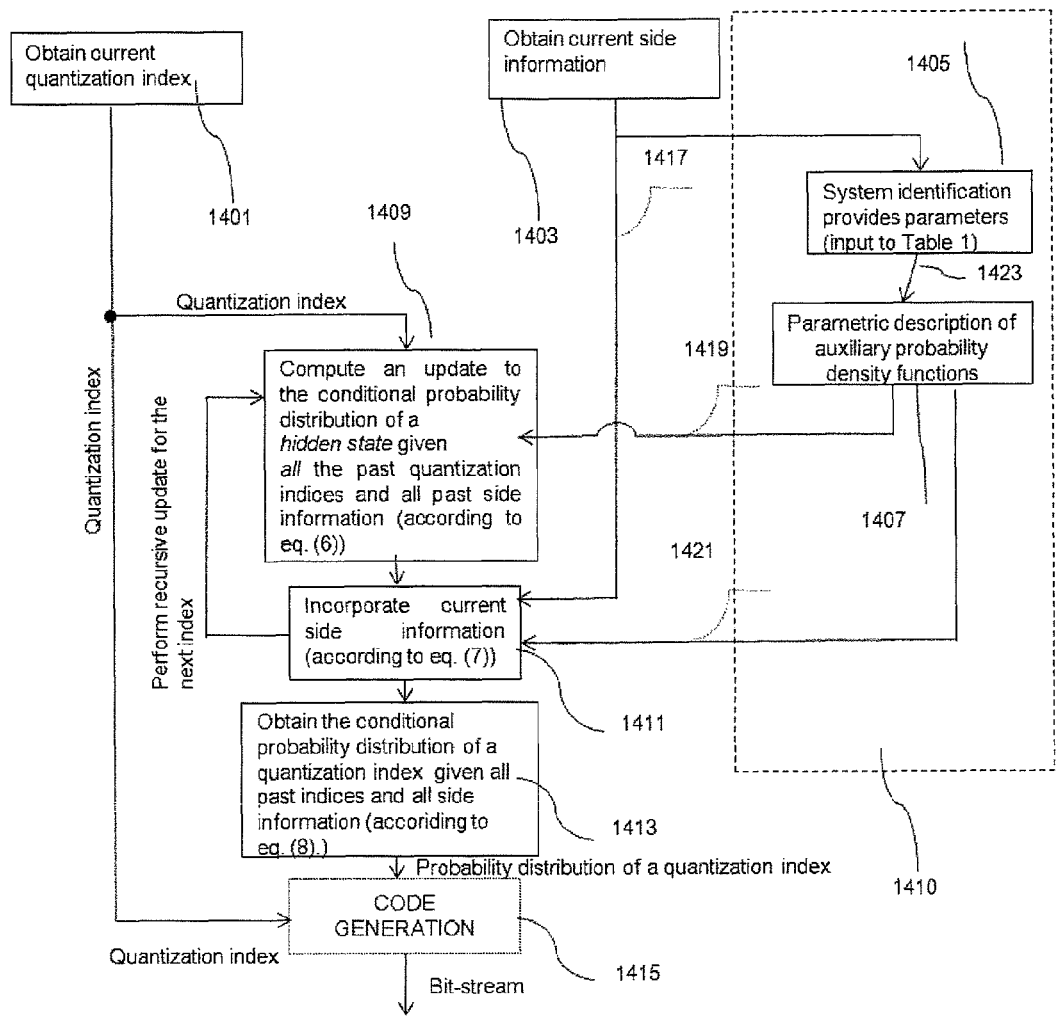
FIG. 14 shows a diagram of a coding method according to an implementation form.

FIG. 14 shows a diagram of a coding method comprising obtaining current quantization index 1401, obtaining current side information 1403, parametric description 1407 of auxiliary probability density functions system identification 1409 providing parameters, computing 1407 an update according to equation (6), incorporating 1411 current side information according to equation (7), obtaining 1413 conditional probability distribution of a quantization index according to equation (8), and generating 1415 the code. The resulting linear system is depicted by the reference numeral 1410. Reference numeral 1417 denotes a set of random variables representing the side information. Reference numeral 1419 denotes a conditional probability density function of the current hidden state given the previous hidden state, reference numeral 1421 denotes a conditional probability density function of the current side information given the past hidden state, the past side information and the past quantization indices, and reference numeral 1423 denotes system parameters which are input parameters in Table I.

Figure 15:
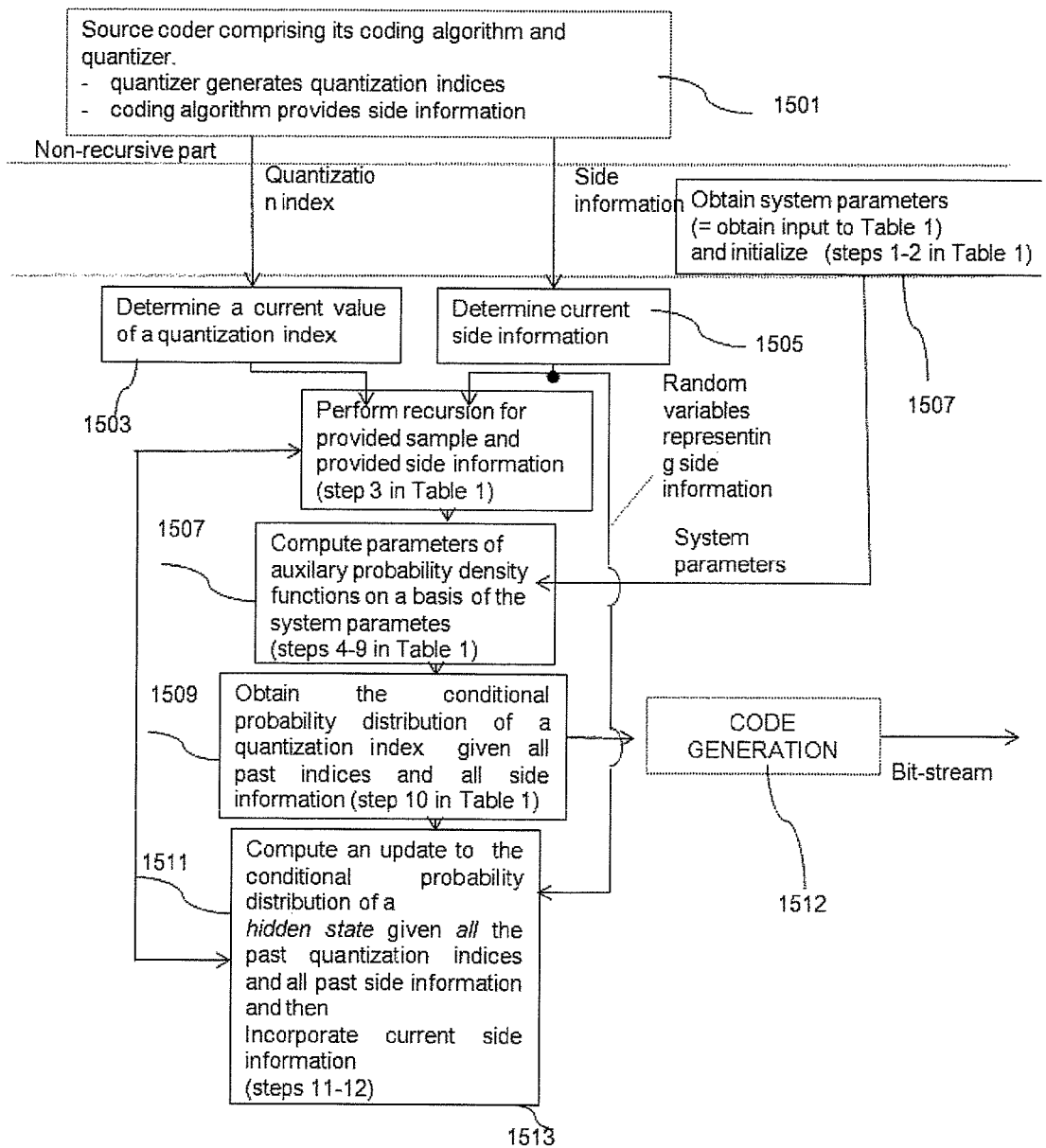
FIG. 15 shows a diagram of a coding method according to an implementation form.

FIG. 15 shows a diagram of a coding method comprising source coding 1501 using a source coder comprising a coding algorithm which facilitates side information and a quantizer which generates quantization indices. The method further comprises determining 1503 a current value of a quantization index, and determining 1505 current side information. The method further comprises obtaining 1507 system parameters which are input to Table I, and initializing, steps 1-2 in Table I. The method further comprises performing 1507 recursion for provided sample and provided side information, step 3 in Table I, computing 1509 parameters of auxiliary probability density functions on a basis of the system parameters, steps 4-9 in Table I, obtaining 1511 the conditional probability distribution of an index given all past indices and all side information, step 10 in Table I, code generating 1512 and computing 1513 an update to the conditional probability distribution of a hidden state given all the past quantization indices and all past side information and then incorporating current side information, steps 11-12 in Table I.

Figure 16:
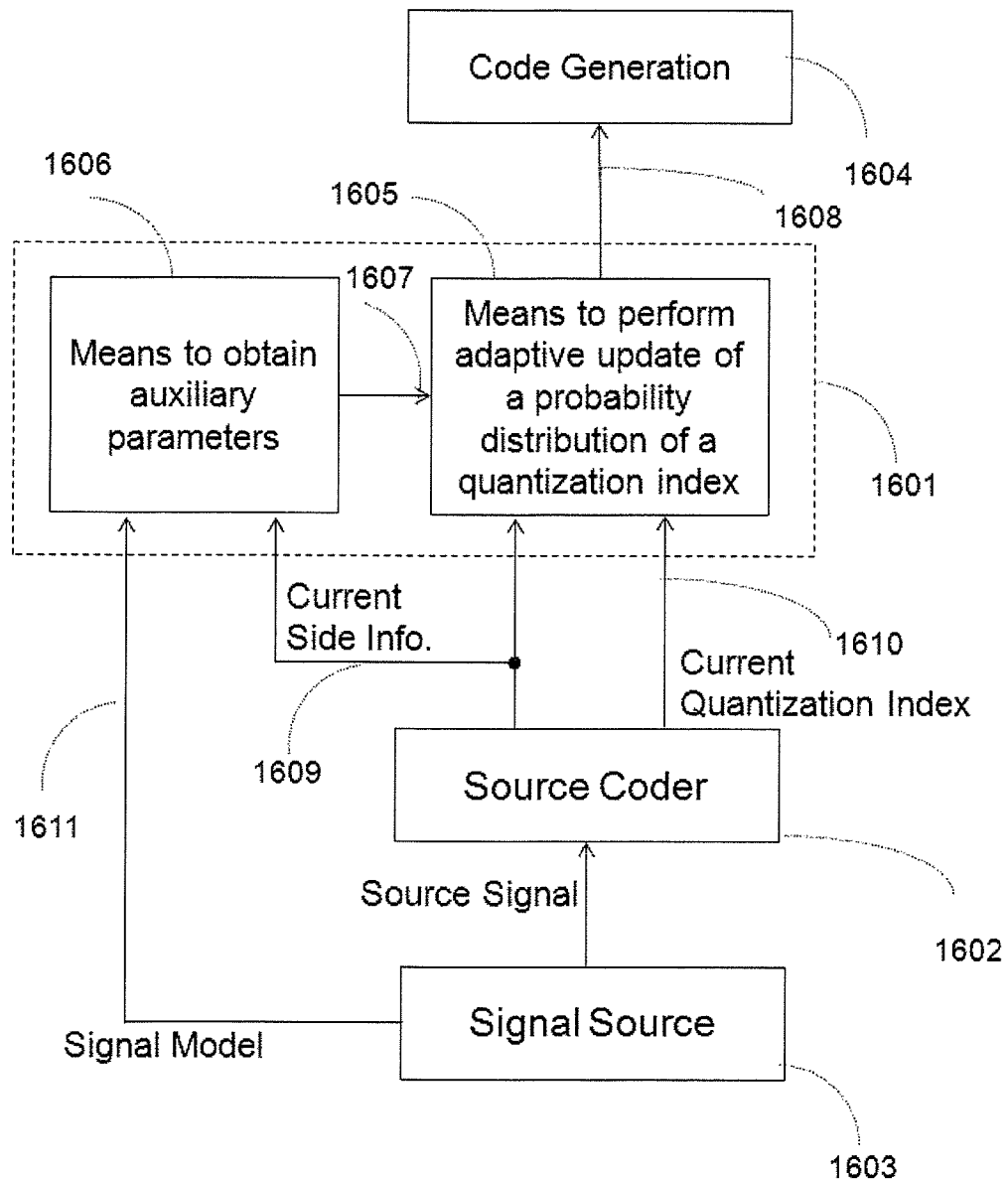
FIG. 16 shows a block diagram of a signal coder comprising a source coder block, a code generation block and an estimator.

FIG. 16 shows a block diagram of a signal coder comprising a source coder block 1602, a code generation block 1604 and an estimator 1601 of a probability distribution of a quantization index. The source coder block 1602 operates on source signal generated by a signal source 1603 that is described by a signal model 1611. The source coder block outputs a current quantization index 1610 and current side information 1609. The estimator is provided with a current quantization index 1610, current side information 1609 and the signal model 1611. The estimator 1601 comprises a means to obtain auxiliary parameters 1606 and a means to perform an adaptive update of a probability of a quantization index 1605. The block representing the means to obtain auxiliary parameters 1606 is provided with a signal model 1611 and the current side information 1609 and it outputs auxiliary parameters 1607. The block representing the means to perform an adaptive update of a probability distribution of a quantization index 1605 is provided with the current side information 1609, the current quantization index 1610 and the auxiliary parameters 1607 and it provides an estimate of a probability distribution of a quantization index 1608 to the code generation block 1604.

What is claimed is:

1. An estimator for estimating a probability distribution of a quantization index generated from a source coder encoding a source signal into a sequence of quantization indices, the source signal being described by a signal model, the source coder providing a current quantization index and current side information, the estimator being configured to obtain auxiliary parameters based on a configuration of the source coder and the current side information and the signal model, the estimator being further configured to adaptively update the probability distribution of a quantization index upon the basis of a probability density function relating to a previous state of the estimator, the auxiliary parameters, the current quantization index and the current side information.

2. The estimator of claim 1, wherein the current side information indicates a current configuration of the source coder, wherein the estimator is configured to derive the current auxiliary parameters from the signal model, in particular from a linear stochastic signal model of the source signal.

3. The estimator of claim 1, wherein the estimator is configured to derive the current auxiliary parameters from the signal model and the side information, in particular obtained from a linear stochastic signal model of the source signal.

4. The estimator of claim 1, wherein the current side information indicates a current configuration of the source coder, wherein the estimator is configured to derive the current auxiliary parameters from the signal model, in particular obtained from a linear stochastic signal model of the source signal, and wherein the estimator is further configured to update the probability density function using information on the current quantization index and the current parameters of the model of the source signal.

5. The estimator of claim 1, wherein the estimator is configured to derive the auxiliary parameters from an Auto-Regressive-Moving-Average model of the source signal.

6. The estimator of claim 1, wherein the side information provided by the source coder comprises a realization of a dither signal generated by the source coder.

7. The estimator of claim 1, wherein the side information indicates an outcome of a prediction of the source signal performed in the source coder.

8. The estimator of claim 1, wherein the side information indicates at least one of the following:
   a realization of dither signal and an outcome of a closed-loop prediction of the source signal performed in the source coder; and
   an open-loop prediction of the source signal performed in the source coder and delayed observation of the source signal.

9. The estimator of claim 1, wherein the probability function relating to the state of the estimator is $f(\xi_n|q_1^{n-1}, s_1^{n-1}) \propto \int_A f(\xi_{n-1}|q_1^{n-2}, s_1^{n-1}) f(\xi_n|\xi_{n-1}) p(q_{n-1}|\xi_{n-1}, s_{n-1}) d\xi_{n-1}$ where $\xi_n$ is the n-th realization of the hidden state, A denotes the alphabet from which the hidden states take values, $q_1^{n-1}$ is a vector containing n−1 previous indices and $s_1^{n-1}$ is a vector containing n−1 previous realizations of side information $S_1^{n-1}$, and $f(\xi_{n-1}|q_1^{n-2},s_1^{n-1})$ is the probability density function relating to the previous state of the estimator, $f(\xi_n|\xi_{n-1})$ is a conditional probability density function of the current hidden state given the previous hidden state, and $p(q_{n-1}|\xi_{n-1}, s_{n-1})$ is the probability of the previous quantization index $q_{n-1}, \xi_{n-1}$ is a realization of the previous hidden state and $s_{n-1}$ is the previous realization of the side information.

10. The estimator of claim 1, being configured to adaptively update the probability distribution of a quantization index $p(q_n|q_1^{n-1},s_1^n)$ upon the basis of updating the probability density function relating to the state of the estimator to in response the current side information $s_n$, according to $f(\xi_n|q_1^{n-1},s_1^n) \propto f(\xi_n|q_1^{n-1},s_1^{n-1}) f(s_n|\xi_n,q_1^{n-1},s_1^{n-1})$, where $f(\xi_n|q_1^{n-1},s_1^{n-})$ is the probability density function relating to the previous state of the estimator and $f(s_n|\xi_n,q_1^{n-1},s_1^{n-1})$ is the probability density function of the current side information $s_n$ conditioned on a current hidden state $\xi_n$, all previous quantization indices represented by the vector $q_1^{n-1}$ and all the previous side information represented by $s_1^{n-1}$, where $f(s_n|\xi_n,q_1^{n-1},s_1^{n-1})$ is computed in response to the current side information, wherein the probability distribution of a quantization index being updated according to $p(q_n|q_1^{n-1}, s_1^n) = \int_A p(q_n|\xi_n, s_n) f(\xi_n|q_1^{n-1},s_1^n) d\xi_n$ where $p(q_n|\xi_n, s_n)$ is the probability distribution of a quantization index $q_n$ conditioned on the current state of the estimator $\xi_n$ and current side information $s_n$.

11. The estimator of claim 1, being configured to adaptively update the probability distribution of a quantization index upon the basis of the following estimate of the probability density function relating to the state of the estimator: $f(\xi_n|q_1^{n-1},s_1^{n-1}) \approx N(\xi_n;\mu_n,\Sigma_n)$, wherein the mean $\mu_n$ is computed as the expectation about the current hidden state $\Xi_n$ (207), given all previous quantization indices and all previous realizations of side information, according to $\mu_n = E\{\Xi_n|Q_1^{n-1},S_1^{n-1}\}$, and wherein the covariance matrix is computed according to $\Sigma_n = E\{(\Xi_n-\mu_n)(\Xi_n-\mu_n)^T|Q_1^{n-1},S_1^{n-1}\}$, where $T$ denotes matrix transposition and E denotes an expectation.

12. A coding apparatus for coding a source signal, the coding apparatus comprising:
- a source coder for coding the source signal into a sequence of quantization indices, the source coder configured to provide a current quantization index and current side information;
- a lossless coder configured to encode the quantization indices into code words in dependency on a probability distribution of the quantization indices; and
- an estimator for estimating a probability distribution of the current quantization index generated from the source coder, the source signal being described by a signal model, the estimator being configured to obtain auxiliary parameters based on a configuration of the source coder and the current side information and the signal model, the estimator being further configured to adaptively update a probability distribution of a quantization index upon the basis of a probability density function relating to a previous state of the estimator, the auxiliary parameters, the current quantization index and the current side information.

13. A decoding apparatus for decoding a source signal being encoded by a source coder using quantization indices, the decoding apparatus comprising:
- a receiver configured to receive a bit stream with code words and current side information;
- an estimator for estimating a probability distribution of a current quantization index generated from the source coder, the source signal being described by a signal model, the estimator being configured to obtain auxiliary parameters based on a configuration of the source coder and current side information and the signal model, the estimator being further configured to adaptively update a probability distribution of a quantization index upon the basis of a probability density function relating to a previous state of the estimator, the auxiliary parameters, the current quantization index and the current side information; and
- a decoder for decoding a sequence of quantization indices and for providing the current quantization index for a reconstruction of the source signal based on the probability distribution of a quantization index.

14. The decoding apparatus of claim 13, wherein the current side information indicates a current configuration of the source coder, wherein the estimator is configured to derive the current auxiliary parameters from the signal model, in particular from a linear stochastic signal model of the source signal.

15. The decoding apparatus of claim 13, wherein the estimator is configured to derive the current auxiliary parameters from the signal model and the side information, in particular obtained from a linear stochastic signal model of the source signal.

16. The decoding apparatus of claim 13, wherein the current side information indicates a current configuration of the source coder, wherein the estimator is configured to derive the current auxiliary parameters from the signal model, in particular obtained from a linear stochastic signal model of the source signal, and wherein the estimator is further configured to update the probability density function using information on the current quantization index and the current parameters of the model of the source signal.

17. The decoding apparatus of claim 13, wherein the estimator is configured to derive the auxiliary parameters from an Auto-Regressive-Moving-Average model of the source signal.

18. The decoding apparatus of claim 13, wherein the side information provided by the source coder comprises a realization of a dither signal generated by the source coder.

19. The decoding apparatus of claim 13, wherein the side information indicates an outcome of a prediction of the source signal performed in the source coder.

20. The decoding apparatus of claim 13, wherein the side information indicates at least one of the following:
- a realization of dither signal and an outcome of a closed-loop prediction of the source signal performed in the source coder; and
- an open-loop prediction of the source signal performed in the source coder and delayed observation of the source signal.

21. The decoding apparatus of claim 13, wherein the probability function relating to the state of the estimator is $f(\xi_n|q_1^{n-1},s_1^{n-1}) \propto \int_A f(\xi_{n-1}|q_1^{n-2},s_1^{n-1}) f(\xi_n|\xi_{n-1}) p(q_{n-1}|\xi_{n-1}, s_{n-1}) d\xi_{n-1}$ where $\xi_n$ is the n-th realization of the hidden state, A denotes the alphabet from which the hidden states take values, $q_1^{n-1}$ is a vector containing n−1 previous indices and $s_1^{n-1}$ is a vector containing n−1 previous realizations of side information $S_1^{n-1}$ and $f(\xi_{n-1}|q_1^{n-2},s_1^{n-1})$ is the probability density function relating previous state of the estimator, $f(\xi_n|\xi_{n-1})$ is a conditional probability density function of the current hidden state given the previous hidden state, and $p(q_{n-1}|\xi_{n-1},s_{n-1})$ is the probability of the previous quantization index $q_{n-1}, \xi_{n-1}$ is a realization of the previous hidden state and $s_{n-1}$ is the previous realization of the side information.

22. The decoding apparatus of claim 13, being configured to adaptively update the probability distribution of a quantization index $p(q_n|q_1^{n-1},s_1^{n-1})$ upon the basis of updating the probability density function relating to the state of the estimator to in response the current side information $s_n$ according to $f(\xi_n|q_1^{n-1},s_1^n) \propto f(\xi_n|q_1^{n-1},s_1^{n-1})f(s_n|\xi_n,q_1^{n-1},s_1^{n-1})$, where $f(\xi_n|q_1^{n-1},s_1^{n-1})$ is the probability density function relating to the previous state of the estimator and $f(s_n|\xi_n, q_1^{n-1},s_1^{n-1})$ is the probability density function of the current side information $s_n$, conditioned on a current hidden state $\xi_n$, all previous quantization indices represented by the vector $q_1^{n-1}$ and all the previous side information represented by $s_1^{n-1}$ where $f(s_n|\xi_n,q_1^{n-1},s_1^{n-1})$ is computed in response to the current side information, wherein the probability distribution of a quantization index being updated according to $p(q_n|q_1^{n-1},s_1^n)=\int_A p(q_n|\xi_n,s_n)f(\xi_n|q_1^{n-1},s_1^n)d\xi_n$ where $p(q_n|\xi_n, s_n)$ is the probability distribution of a quantization index $q_n$ conditioned on the current state of the estimator $\xi_n$ and current side information $s_n$.

23. The decoding apparatus of claim 13, wherein the estimator is further configured to adaptively update the probability distribution of a quantization index upon the basis of the following estimate of the probability density function relating to the state of the estimator: $f(\xi_n|q_1^{n-1},s_1^{n-1}) \approx N(\xi_n;\mu_n,\Sigma_n)$, wherein the mean $\mu_n$ is computed as the expectation about the current hidden state $\Xi_n$ (207), given all previous quantization indices and all previous realizations of side information, according to $\mu_n=E\{\Xi_n|Q_1^{n-1},S_1^{n-1}\}$, and wherein the covariance matrix is computed according to $\Sigma_n=E\{(\Xi_n-\mu_n)(\Xi_n-\mu_n)^T|Q_1^{n-1},S_1^{n-1}\}$, where $^T$ denotes matrix transposition and E denotes an expectation.

24. An estimation method for estimating a probability distribution of a quantization index generated from a source coder encoding a source signal into a sequence of quantization indices, the source signal being described by a signal model, the source coder providing a current quantization index and current side information, the method comprising:

obtaining auxiliary parameters based on a configuration of the source coder, the current available side information and the model of the signal model; and adaptively updating the probability distribution of a quantization index upon the basis of a probability density function relating to a previous state of the estimator, the auxiliary parameters, the current quantization index and the current side information.

25. A coding method for coding a source signal, the method comprising:

encoding the source signal into a sequence of quantization indices and providing a current quantization index and current side information;

losslessly encoding the quantization indices into code words in dependency on a probability distribution of the quantization indices; and estimating the probability of a quantization index generated from the source coder according to the method for estimating a probability distribution of a quantization index of claim 24.

26. A decoding method for decoding a source signal, the method comprising:

receiving a bit stream with code words and current side information; and estimating the probability of a quantization index generated from the source coder according to the method for estimating a probability distribution of a quantization index of claim 24; and decoding a sequence of quantization indices and providing a current quantization index into a reconstruction of a source signal based on the probability distribution of a quantization index.

\* \* \* \* \*